US012700863B2

(12) United States Patent
Kim et al.

(10) Patent No.: US 12,700,863 B2
(45) Date of Patent: Aug. 4, 2026

(54) UNIVERSAL LOGIC MEMORY BLOCK USING UNIVERSAL LOGIC MEMORY CELLS

(71) Applicant: KOREA UNIVERSITY RESEARCH AND BUSINESS FOUNDATION, Seoul (KR)

(72) Inventors: Sang Sig Kim, Seoul (KR); Kyoung Ah Cho, Seoul (KR); Jong Seong Han, Chungcheongnam-do (KR); Jae Min Son, Seongnam-si (KR); Ju Hee Jeon, Seoul (KR); Yun Woo Shin, Gwangmyeong-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 85 days.

(21) Appl. No.: 18/948,406

(22) Filed: Nov. 14, 2024

(65) Prior Publication Data

US 2025/0211235 A1 Jun. 26, 2025

(30) Foreign Application Priority Data

Dec. 26, 2023 (KR) ........................ 10-2023-0191706

(51) Int. Cl.
*H03K 19/17724* (2020.01)
*H03K 19/17788* (2020.01)
(Continued)

(52) U.S. Cl.
CPC . *H03K 19/17724* (2013.01); *H03K 19/17788* (2013.01); *H03K 19/17796* (2013.01); *H03K 19/21* (2013.01)

(58) Field of Classification Search
CPC ........... H03K 19/177; H03K 19/17704; H03K 19/17724; H03K 19/17736;
(Continued)

(56) References Cited

U.S. PATENT DOCUMENTS 9,654,111 B1 * 5/2017 Muchsel .......... H03K 19/17736
2007/0176643 A1 * 8/2007 Nugent ................. H03K 19/02
257/E27.071
(Continued)

FOREIGN PATENT DOCUMENTS

KR 10-0413881 B1 3/2004
KR 10-2022-0014996 A 2/2022
(Continued)

OTHER PUBLICATIONS

An Office Action, "Notice of Reasons for Refusal," mailed by the Japanese Patent Office on Dec. 9, 2025, which corresponds to Japanese Patent Application No. 2024-200069 and is related to U.S. Appl. No. 18/948,406.
(Continued)

*Primary Examiner* — Jason M Crawford
(74) *Attorney, Agent, or Firm* — Studebaker Brackett PLLC

(57) ABSTRACT

The present disclosure relates to a universal logic memory block using a plurality of universal logic memory cells. The universal logic memory block according to one embodiment of the present disclosure may implement various combinational logical operations in a single structure by combining logical operation results from a plurality of universal logic memory cells using triple-gate silicon devices driven by a positive feedback loop.

14 Claims, 27 Drawing Sheets

(51) Int. Cl.
  *H03K 19/17796*    (2020.01)
  *H03K 19/21*    (2006.01)

(58) Field of Classification Search
  CPC ......... H03K 19/1778; H03K 19/17788; H03K
    19/17796; H03K 19/20; H03K 19/21;
    H03K 19/215; H03K 2017/6878; H10D
    12/211; H10D 12/212; H10D 12/411;
    H10D 30/60; H10D 30/611; H10D 30/80;
    H10D 30/873
  See application file for complete search history.

(56)           References Cited

U.S. PATENT DOCUMENTS

| | | |
|---|---|---|
| 2014/0197864 A1 | 7/2014 | Prabhakar |
| 2025/0211235 A1* | 6/2025 | Kim ...................... H10D 30/611 |
| 2025/0211236 A1* | 6/2025 | Kim ...................... G11C 11/54 |
| 2025/0275117 A1* | 8/2025 | Kim ...................... H10B 12/20 |
| 2025/0299035 A1* | 9/2025 | Kim ...................... G06N 3/045 |

FOREIGN PATENT DOCUMENTS

| | | |
|---|---|---|
| KR | 10-2022-0145226 A | 10/2022 |
| KR | 10-2475066 B1 | 12/2022 |
| KR | 10-2023-0020840 A | 2/2023 |

OTHER PUBLICATIONS

Amagasaki, Taiki, "Principle and Configuration of FPGA," 1st Edition, Japan, Ohmsha, Ltd., May 11, 2017, pp. 35-36 and 61-62.
An Office Action mailed by the Korean Intellectual Property Office on Apr. 4, 2025, which corresponds to Korean Patent Application No. 10-2023-0191706 and is related to U.S. Appl. No. 18/948,406.
Shankar, B. et al; "Low power adder using multi gate FET in 32nm technology"; 2022 2nd International Conference on Advance Computing and Innovative Technologies in Engineering (ICACITE); Apr. 28, 2022; pp. 1576-1579; IEEE; Greater Noida, India; XP034149953; DOI: 10.1109/ICACITE53722.2022.9823595.
Extended European Search Report issued in EP 24 212 983.1-1201 by the European Patent Office on May 26, 2025, which is related to U.S. Appl. No. 18/948,406.

* cited by examiner

2100

UNIVERSAL LOGIC MEMORY BLOCK USING UNIVERSAL LOGIC MEMORY CELLS

CROSS-REFERENCE TO RELATED APPLICATION

This application claims priority to Korean Patent Application No. 10-2023-0191706, filed on Dec. 26, 2023, in the Korean Intellectual Property Office, the disclosure of which is incorporated herein by reference.

BACKGROUND OF THE DISCLOSURE

Field of the Disclosure

The present disclosure relates to a universal logic memory block using a plurality of universal logic memory cells, and more particularly, to technology for implementing a universal logic memory block that implements various combinational logical operations in a single structure by combining the results of logical operations in a plurality of universal logic memory cells using a triple-gate silicon device driven by a positive feedback loop.

Description of the Related Art

In existing von Neumann-based computer systems, a processor and a memory are separated and data is transmitted through a bus.

However, as computing performance improved, bottlenecks occurred due to the difference in data processing speed between the processor and memory, and limitations in processing large amounts of data began to appear.

That is, the von Neumann-based system, a revolutionary development in the semiconductor industry, improved the integration density and performance of modern computers, but the von Neumann-based system has the disadvantages of consuming a lot of energy and having long data transmission time and latency time due to the physical separation between the processor and memory hierarchy.

Given the increase of data-intensive applications such as 5G communication standards, the Internet of Things (IoT), and artificial intelligence (AI) following the Fourth Industrial Revolution, new computing paradigms are essential to meet massive data processing requirements.

To solve the above-mentioned problems, research on logic memory (logic in memory, LIM) technology that combines computational and memory functions is being focused and accelerated.

Since the logic memory technology performs the computational function of a processor and the memory function of a memory in the same space, the logic memory technology can reduce delay time and power consumption that occur during data transmission and greatly improve the integration of a system.

Conventional logic memory technology has been actively studied based on volatile memory devices such as static random access memory (SRAM) and dynamic RAM (DRAM), and nonvolatile memory devices such as resistive RAM (ReRAM), magnetoresistive RAM (MRAM), and phase-change RAM (PCRAM).

In the case of logic memory technology based on volatile memory devices, a large number of transistors are required for stable operation, which limits the overall area and power consumption.

In addition, logic memory technology based on nonvolatile memory devices requires a complex process using non-silicon materials, and is difficult to commercialize due to low device uniformity and stability.

In addition, previously studied logic memory technologies cannot implement all basic CMOS logic operations in a single cell and have low integration as individual circuits and wiring are required depending on the logic operation.

Therefore, there is a need to develop a universal logic memory cell that can be manufactured using a silicon-based CMOS process and performs all basic logic operations and stores values within a single cell.

The conventional logic memory technology has been researched using various memories including volatile memory devices such as dynamic random access memory (DRAM) and static RAM (SRAM) and nonvolatile memory devices such as phase-change RAM (PRAM), resistive RAM (ReRAM), and magnetoresistive RAM (MRAM).

However, these memories cannot define n-channel and p-channel, making it difficult to apply the memories to existing CMOS logic operations.

In particular, logic-memory technologies based on non-volatile memory devices mostly require new processes other than silicon-based CMOS processes, and are difficult to commercialize due to low device uniformity and reliability.

Combinational logic operations are performed in a structure where basic logic operations are arranged sequentially, and a logic operation circuit of a specific structure is required for each logic operation, making it difficult to improve integration.

SUMMARY OF THE DISCLOSURE

Therefore, the present disclosure has been made in view of the above problems, and it is an object of the present disclosure to implement a universal logic memory block that implements various combinational logical operations in a single structure by combining the results of logical operations in a plurality of universal logic memory cells using a triple-gate silicon device driven by a positive feedback loop.

It is another object of the present disclosure to implement a universal logic memory block that performs a combinational logical operation that combines logical operation results using a CMOS process and memorizes the results of the combinational logical operation.

It is still another object of the present disclosure to implement a universal logic memory cell using a triple-gate silicon device, which is a silicon-based feedback memory device using a conventional CMOS process, and implement a universal logic memory block using the universal logic memory cell that performs binary combinational logical operations and memorizes the operation results.

It is still another object of the present disclosure to improve processing speed and integration limitation due to data bottleneck through the fusion of logical operation and storage function.

It is still another object of the present disclosure to implement a universal logic memory block that performs various binary combinational logical operations in a single structure through the channel mode reconfiguration characteristics of a triple-gate silicon device, thereby significantly improving computational efficiency compared to conventional CMOS logic circuits.

It is yet another object of the present disclosure to improve standby power efficiency by using channel mode reconfiguration characteristics and excellent memory characteristics that maintain logical operation values without structural changes and external biases.

In accordance with one aspect of the present disclosure, provided is a universal logic memory block including universal logic memory cells including a first network device and a second network device using a plurality of triple-gate silicon devices; a switch box that determines directions of an input voltage applied to the universal logic memory cells and an output voltage output from the universal logic memory cells; and a line switch that controls interconnection between the switch box and the universal logic memory cells, wherein, in a structure in which the universal logic memory cells are arranged according to preset settings, a combination logic operation function and memory function are performed according to interconnection control for a logic operation function of the universal logic memory cells according to the determined input voltage and output voltage directions.

The universal logic memory cells may be arranged in a plurality of rows and a plurality of columns according to the preset settings, the switch box and the line switch may be placed between the universal logic memory cells, the number of the line switches may be determined to correspond to the number of input voltages transmitted through the switch box, and the combination logic operation function may be implemented with at least one output based on the output voltage.

The switch box may apply a first input voltage ($V_{IN1}$) and a second input voltage ($V_{IN2}$) to the universal logic memory cell operating as an XOR gate and the universal logic memory cell operating as an AND gate, among the logic operation functions, among the universal logic memory cells arranged in the rows and columns, output, as a sum(S), an output from the universal logic memory cell operating as the XOR gate, and output, as a carry digit (COUT), an output from the universal logic memory cell operating as the AND gate.

The switch box may apply a first input voltage ($V_{IN1}$), a second input voltage ($V_{IN2}$), and a third input voltage ($V_{CIN}$) to the universal logic memory cells operating as a first XOR gate and a second XOR gate and the universal logic memory cells operating as a first AND gate and a second AND gate, among the logic operation functions, among the universal logic memory cells arranged in the rows and columns, output, as a sum (S), an output from the universal logic memory cell operating as the second XOR gate, and transfer outputs from the universal logic memory cells operating as the first AND gate and the second AND gate to inputs of the universal logic memory cell operating as an OR gate and then output an output voltage as a carry digit (COUT).

The switch box may apply an input voltage ($V_{IN}$) to the universal logic memory cells operating as a first AND gate and a second AND gate among the universal logic memory cells arranged in the rows and columns, apply a selection voltage ($V_S$) to the universal logic memory cell operating as an NOT gate among the logic operation functions, output an output from the universal logic memory cell operating as the first AND gate as a first output (OUT1), and output an output from the universal logic memory cell operating as the second AND gate as a second output (OUT2).

The switch box may apply a first input voltage ($V_{IN1}$) and a second input voltage ($V_{IN2}$) to the universal logic memory cells operating as a first AND gate and a second AND gate among the universal logic memory cells arranged in the rows and columns, apply a selection voltage ($V_S$) to the universal logic memory cell operating as an NOT gate among the logic operation functions, and transfer an output from the universal logic memory cell operating as the first AND gate and an output from the universal logic memory cell operating as the second AND gate as inputs of the universal logic memory cell operating as an OR gate and output an output voltage as an output (OUT).

The switch box may selectively apply a first input voltage ($V_{IN1}$) and a second input voltage ($V_{IN2}$) to the universal logic memory cells operating as a first AND gate, a second AND gate, a third AND gate, and a fourth AND gate and the universal logic memory cells operating as a first NOT gate and a second NOT gate, among the logic operation functions, among the universal logic memory cells arranged in the rows and columns, control an output of the universal logic memory cell operating as the first AND gate as a first output (OUT1), control an output of the universal logic memory cell operating as the second AND gate as a second output (OUT2), control an output of the universal logic memory cell operating as the third AND gate as a fourth output (OUT4), and control an output of the universal logic memory cell operating as the fourth AND gate as a third output (OUT3).

The switch box may apply a second input voltage ($V_{IN2}$), a third input voltage ($V_{IN3}$), and a fourth input voltage ($V_{IN4}$) to the universal logic memory cells operating as a first OR gate and a second OR gate among the universal logic memory cells arranged in the rows and columns, control an output of the universal logic memory cell operating as the first OR gate as a first output (OUT1), and control an output of the universal logic memory cell operating as the second OR gate as a second output (OUT2).

The switch box may selectively apply a first input voltage ($V_{IN1}$) and a second input voltage ($V_{IN2}$) to the universal logic memory cells operating as an XNOR gate and an XOR gate, the universal logic memory cells operating as a first NOT gate and a second NOT gate, and the universal logic memory cells operating as a first AND gate and a second AND gate among the universal logic memory cells arranged in the rows and columns, control an output of the universal logic memory cell operating as the XNOR gate as a first output (OUT1), control an output of the universal logic memory cell operating as the XOR gate as a second output (OUT2), control an output of the universal logic memory cell operating as the second AND gate as a third output (OUT3), and control an output of the universal logic memory cell operating as the first AND gate as a fourth output (OUT4).

The switch box may selectively apply a first input voltage ($V_{IN1}$), a second input voltage ($V_{IN2}$), and a third input voltage ($V_{IN3}$) to the universal logic memory cells operating as a first XOR gate and a second XOR gate among the universal logic memory cells arranged in the rows and columns, control the first input voltage ($V_{IN1}$) as a first output (OUT1), control an output of the universal logic memory cell operating as the first XOR gate as a second output (OUT2), and control an output of the universal logic memory cell operating as the second XOR gate as a third output (OUT3).

The universal logic memory cell may include a first network device and a second network device using a plurality of triple-gate silicon devices, wherein each of the triple-gate silicon devices includes a drain region, a channel region, and a source region; a supply voltage is applied to the drain region and the source region; a gate region on which first and second programming gate electrodes and a control gate electrode are formed is formed on the channel region; depending on a level of a program voltage ($V_{PG}$) applied through the first and second programming gate electrodes, the channel region under the first and second programming gate electrodes operates in one of a first channel mode and a second channel mode; the triple-gate silicon device is determined to be in either an on-state or an off-state based on a level of a control voltage ($V_{CG}$) applied through the control gate electrode; and the first and second network devices perform the logic operation function and the memory function depending on a level of an output voltage ($V_{OUT}$) changed depending on any one of the states in any one of the channel modes.

The first and second network devices may be composed of a first parallel connection formed by connecting common drain regions between a first serial connection in which the drain regions and source regions of two of the four triple-gate silicon devices are connected in series and a second serial connection in which the drain regions and source regions of the remaining two triple-gate silicon devices are connected in series and a second parallel connection formed by connecting common source regions therebetween, a drain voltage ($V_{DD}$) of the common voltage may be applied through the first parallel connection of the first network device, a source voltage ($V_{SS}$) of the common voltage may be applied through the second parallel connection of the second network device, and an output voltage ($V_{OUT}$) may be measured at a point where the second parallel connection of the first network device and the first parallel connection of the second network device are connected.

In the triple-gate silicon device, the drain region may be in a p-doped state, the source region may be in an n-doped state, the channel region may be in an intrinsic state, and the channel region under the first and second programming gate electrodes may operate as an n-channel corresponding to the first channel mode when a level of the program voltage ($V_{PG}$) is a positive level and operate as a p-channel corresponding to the second channel mode when a level of the program voltage ($V_{PG}$) is a negative level.

In the universal logic memory cell, when a drain voltage ($V_{DD}$) applied to the drain region, a source voltage ($V_{SS}$) applied to the source region, the program voltage ($V_{PG}$), and the control voltage ($V_{CG}$) are applied at a zero level, the memory function may be performed by maintaining a level of the output voltage ($V_{OUT}$).

BRIEF DESCRIPTION OF THE DRA WINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1A:
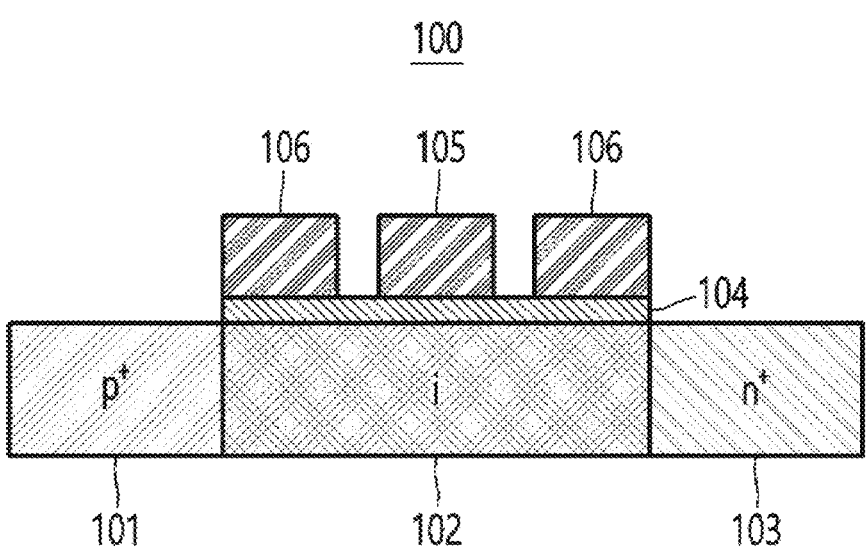
FIGS. 1A and 1B are diagrams illustrating a triple-gate silicon device constituting a universal logic memory cell according to one embodiment of the present disclosure.

Hereinafter, various embodiments of this document are described with reference to the attached diagrams.

However, it should be understood that the present disclosure is not limited to the embodiments according to the concept of the present disclosure, but includes changes, equivalents, or alternatives falling within the spirit and scope of the present disclosure.

In the following description of the present disclosure, detailed description of known functions and configurations incorporated herein will be omitted when it may make the subject matter of the present disclosure unclear.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), the first element may be directly connected to the second element or may be connected to the second element via an intervening element (e.g., third).

As used herein, "configured to" may be used interchangeably with, for example, "suitable for", "ability to", "changed to", "made to", "capable of", or "designed to" in terms of hardware or software.

In some situations, the expression "device configured to" may mean that the device "may do~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless mentioned otherwise or clearly inferred from context, the expression "x uses a or b" means any one of natural inclusive permutations.

Terms, such as "unit" or "module", etc., should be understood as a unit that processes at least one function or operation and that may be embodied in a hardware manner, a software manner, or a combination of the hardware manner and the software manner.

Figure 1B:
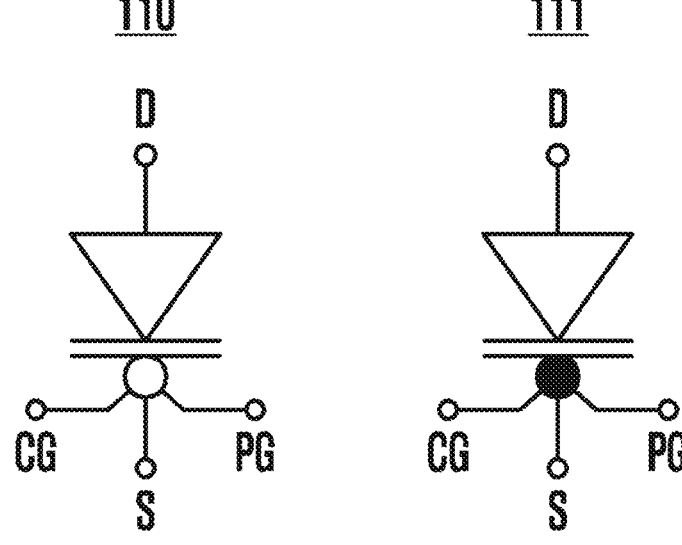

FIGS. 1A and 1B are diagrams illustrating a triple-gate silicon device constituting a universal logic memory cell according to one embodiment of the present disclosure.

FIG. 1A illustrates the structure of a triple-gate silicon device constituting a universal logic memory cell according to one embodiment of the present disclosure.

Referring to FIG. 1A, a triple-gate silicon device 100 according to one embodiment of the present disclosure includes a drain region 101, a channel region 102, a source region 103, and gate region, and the gate region includes first and second programming gate electrodes 106 and a control gate electrode 105 formed on a gate insulating film 104.

For example, a drain electrode may be connected to the drain region 101 to apply a drain voltage, and a source electrode may be connected to the source region 103 to apply a source voltage.

According to one embodiment of the present disclosure, the triple-gate silicon device 100 includes the drain region 101, the channel region 102, and the source region 103, which are p-i-n nanostructures.

For example, the drain region 101 may be in a p-doped state, the source region 103 may be in an n-doped state, and the channel region 102 may be in an intrinsic state.

In the channel region 102, the channel region under the first and second programming gate electrodes 106 may operate as an n-channel corresponding to a first channel mode when the level of a program voltage ($V_{PG}$) is a positive level and may operate as a p-channel corresponding to a second channel mode when the level of a program voltage ($V_{PG}$) is a negative level.

The triple-gate silicon device 100 may be configured in multiple units to form a universal logic memory cell.

That is, the triple-gate silicon device 100 is composed of a plurality of units to form a universal logic memory cell, and some of the plurality of units may be configured as a first network device, and others may be configured as a second network device.

In the triple-gate silicon device 100, depending on the level of a program voltage ($V_{PG}$) applied through the first and second programming gate electrodes 106, the channel region under the first and second programming gate electrodes 106 may perform one of a first channel mode and a second channel mode.

In addition, depending on the level of a control voltage ($V_{CG}$) applied through the control gate electrode, the triple-gate silicon device 100 may be determined to be in any one of an on-state and an off-state.

Accordingly, the universal logic memory cell may perform a logic operation function and a memory function based on the level of an output voltage ($V_{OUT}$) that changes depending on any one state in a previously performed channel mode.

For example, the first and second programming gate electrodes 106 are electrically connected so that the same program voltage ($V_{PG}$) may be applied at one time.

FIG. 1B illustrates circuit symbols associated with the operating states of a universal logic memory cell according to one embodiment of the present disclosure.

Referring to FIG. 1B, a circuit symbol 111 according to one embodiment of the present disclosure illustrates a case where the channel region of the triple-gate silicon device performs a first channel mode and operates as an n-channel.

For example, a circuit symbol 110 illustrates a case where the channel region of the triple-gate silicon device performs a second channel mode and operates as a p-channel.

The circuit symbol 110 and the circuit symbol 111 show a structure in which, in a nanostructure including a drain region, a channel region, a source region, and a gate region, the first and second programming gate electrodes and the control gate electrode are formed in the gate region and connected to a programming gate terminal (PG) and a control gate terminal (CG), a drain electrode is formed in the drain region and connected to a drain terminal (D), and a source electrode is formed in the source region and connected to a source terminal(S).

The circuit symbol 111 indicates that the triple-gate silicon device is in a first channel mode through a channel mode state region.

That is, the circuit symbol 111 may represent a channel mode state region in solid form, indicating that the triple-gate silicon device is operating as an n-channel.

The circuit symbol 110 indicates that the triple-gate silicon device is in a second channel mode state through a channel mode state region.

The circuit symbol 110 may represent the channel mode state region as empty, indicating that the triple-gate silicon device is operating in a p-channel mode.

For example, the triple-gate silicon device may be referred to as a triple gate feedback electric field effect device.

Figure 2A:
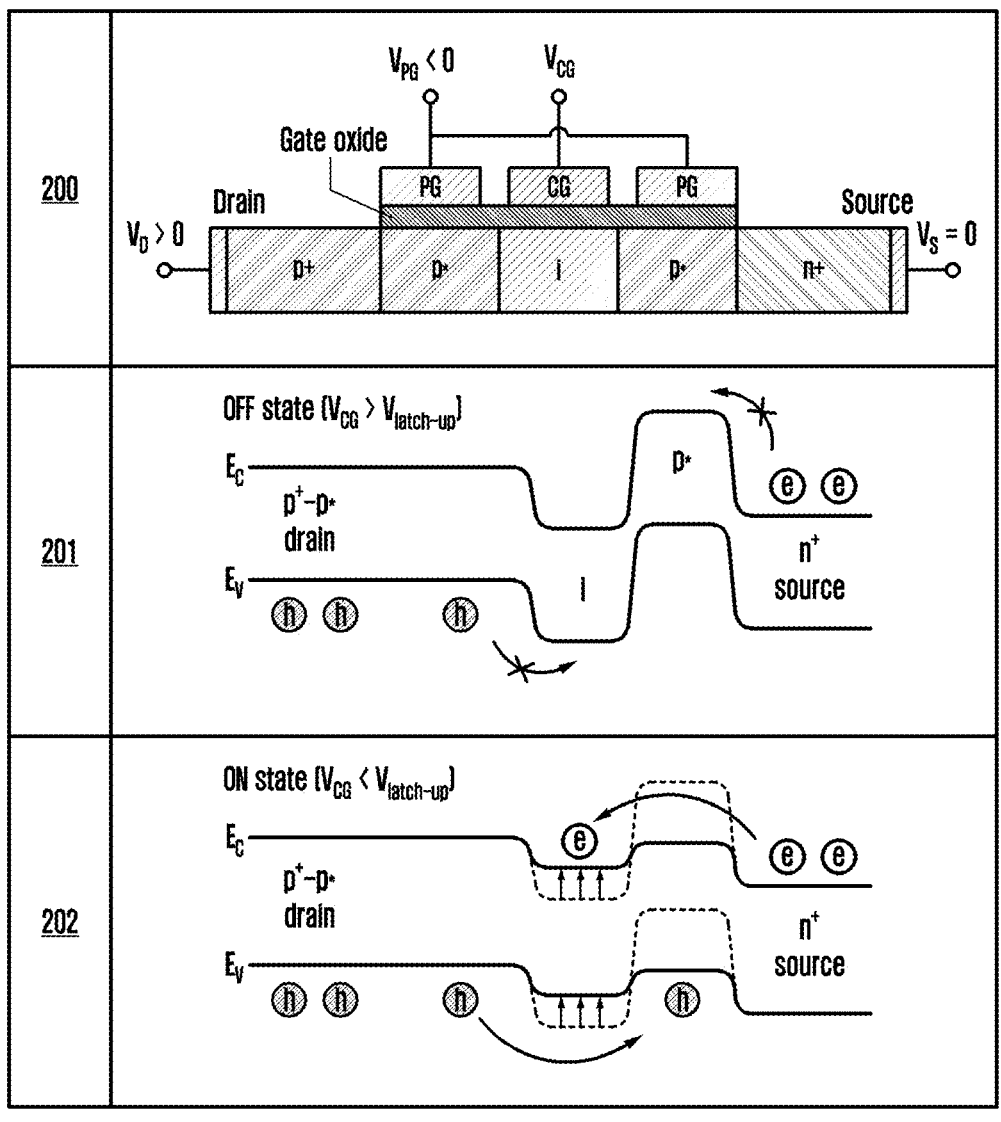
FIGS. 2A to 2C are diagrams illustrating the operating principle of a triple-gate silicon device according to one embodiment of the present disclosure.
Figure 2B:
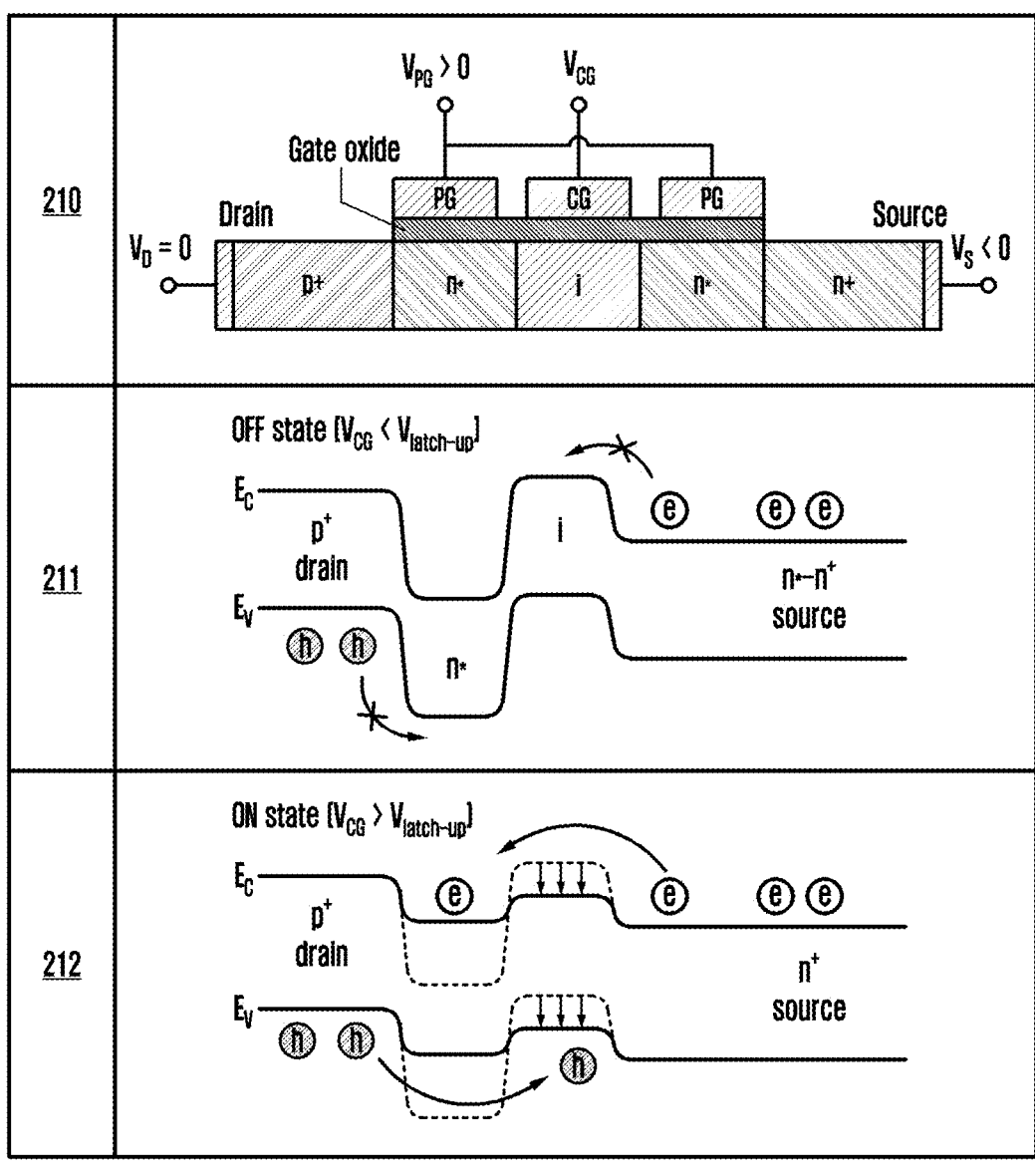
Figure 2C:
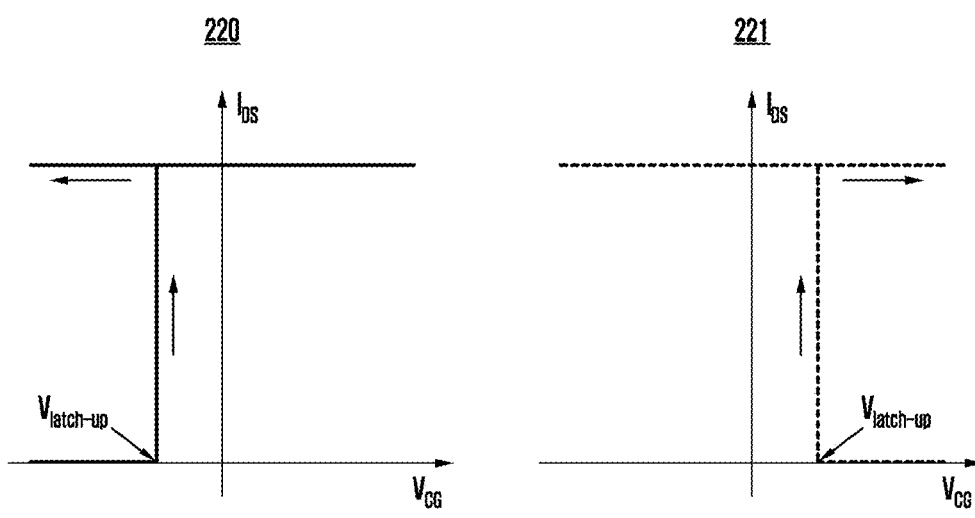

FIGS. 2A to 2C are diagrams illustrating the operating principle of a triple-gate silicon device according to one embodiment of the present disclosure.

FIG. 2A illustrates the operating principle when the triple-gate silicon device according to one embodiment of the present disclosure operates as a p-channel.

Referring to FIG. 2A, when a positive voltage is applied through the drain terminal and a negative voltage corresponding to the level of a program voltage is applied to the programming gate terminal, a triple-gate silicon device 200 according to one embodiment of the present disclosure operates as a p-channel because the channel region under the programming gate electrode (PG) is programmed as a p-channel.

When the triple-gate silicon device 200 according to one embodiment of the present disclosure operates as a p-channel, the operation state is determined to be in an on-state when the level of a control voltage applied through the control gate terminal is lower than a latch-up voltage, which is a voltage at which current increases rapidly, and is determined to be in an off-state when the level of the applied control voltage is higher than the latch-up voltage.

For example, a triple-gate silicon device is determined to be in an on-state or off-state based on the level of a control voltage applied through the control gate terminal.

The on and off operation states of the triple-gate silicon device may be further described through an energy band 201 corresponding to the off-state and an energy band 202 corresponding to the on-state.

When the triple-gate silicon device according to one embodiment of the present disclosure operates as a p-channel, based on the level of a control voltage, the on-state corresponds to the energy band 202, and the off-state corresponds to the energy band 201.

According to the energy band 201 and the energy band 202, when the channel region under the first and second programming gate electrodes performs a second channel mode corresponding to a p-channel mode, when the level of a control voltage ($V_{CG}$) is lower than a latch-up voltage, the height of the potential barrier between the channel region under the control gate electrode and the channel region under the first programming gate electrode adjacent to the drain region is lowered, and a second positive feedback loop occurs in which holes are injected from the drain region due to the lowered potential barrier, resulting in an on-state in which current flows.

That is, the triple-gate silicon device may switch from the energy band 201 to the energy band 202 by inducing a second positive feedback loop.

It can be confirmed that the positive feedback loop occurs as charge injection and accumulation are repeated, and the state is switched to the on-state where current flows.

For example, the second positive feedback loop may be a positive feedback loop in which holes in the channel region become majority carriers.

FIG. 2B illustrates the operating principle when the triple-gate silicon device according to one embodiment of the present disclosure operates in an n-channel mode.

Referring to FIG. 2B, when a negative voltage is applied through the source terminal and a positive voltage corresponding to a positive level of the program voltage is applied to the programming gate terminal, a triple-gate silicon device 210 according to one embodiment of the present disclosure operates as an n-channel because the channel region under the programming gate electrode (PG) is programmed as an n-channel.

For example, a triple-gate silicon device is determined to be in an on-state or off-state based on the level of a control voltage applied through the control gate terminal.

When the triple-gate silicon device 210 according to one embodiment of the present disclosure operates as an n-channel, the operation state may be determined to be in an on-state when the level of a control voltage applied through the control gate terminal is higher than a latch-up voltage, which is a voltage at which current increases rapidly, and may be determined to be in an off-state when the level is lower than the latch-up voltage.

When the triple-gate silicon device according to one embodiment of the present disclosure operates as an n-channel, an energy band 211 corresponding to an off-state based on the level of a control voltage and an energy band 212 corresponding to an on-state are shown.

Referring to the energy band 211 and the energy band 212, when the channel region under the first and second programming gate electrodes performs a first channel mode corresponding to an n-channel mode, when the level of a control voltage ($V_{CG}$) is higher than the latch-up voltage, the height of the potential barrier between the channel region under the control gate electrode and the channel region under the second programming gate electrode adjacent to the source region is lowered, and a first positive feedback loop occurs in which electrons are injected from the source region due to the lowered potential barrier, resulting in an on-state in which current flows.

That is, the triple-gate silicon device has a first positive feedback loop that switches from the energy band 201 to the energy band 202.

It can be confirmed that the positive feedback loop occurs as charge injection and accumulation are repeated, and the state is switched to the on-state where current flows.

For example, the first positive feedback loop may be a positive feedback loop in which electrons are majority carriers in the channel region.

FIG. 2C illustrates the operation associated with the first and second positive feedback loops when the triple-gate silicon device according to one embodiment of the present disclosure operates as an n-channel and a p-channel.

Referring to FIG. 2C, a graph 220 shows the operating characteristics of the n-channel mode of a triple-gate silicon device, and a graph 221 shows the operating characteristics of the p-channel mode of a triple-gate silicon device.

The graph 220 shows that, when the triple-gate silicon device operating in an n-channel mode has an on-state and an off-state depending on a voltage applied to the control gate electrode, when a control gate voltage is smaller than a latch-up voltage, which is a voltage at which current increases rapidly, the flow of electrons and holes is blocked by a potential barrier, resulting in an off-state and an increase in the control gate voltage. As the control gate voltage increases above the latch-up voltage, electrons in the source region are injected into the channel over the potential barrier and accumulate in the potential well adjacent to the drain region, lowering the potential barrier height.

Accordingly, holes in the drain region are injected into the channel and accumulated in the potential well adjacent to the source region, lowering the potential barrier height.

Charge injection and accumulation are repeated to create a positive feedback loop, which results in an on-state where current flows.

The graph 221 shows that, in the case of the triple-gate silicon device operating in an p-channel mode, when the control gate voltage is greater than the latch-up voltage, the flow of electrons and holes is blocked by the potential barrier, resulting in an off-state and a decrease in the control gate voltage. When the control gate voltage is lower than the latch-up voltage, holes in the drain region are injected into the channel over the potential barrier and accumulate in the potential well adjacent to the source region, lowering the potential barrier height.

According to one embodiment of the present disclosure, the triple-gate silicon device may be a device in which a first positive feedback loop or a second positive feedback loop is formed depending on the level of a control voltage applied to the gate region, and in which an on or off state is variably controlled in a first channel mode and a second channel mode. Here, the first channel mode is an n-channel mode, and the second channel mode is a p-channel mode.

In addition, the triple-gate silicon device is turned on by forming a positive feedback loop as charge carriers accumulate in the potential well of the channel region, which may be utilized as a memory function to retain data in the channel region.

Accordingly, the present disclosure may implement a universal logic memory cell using a triple-gate silicon device, which is a silicon-based feedback memory device using a conventional CMOS process.

Figure 3:
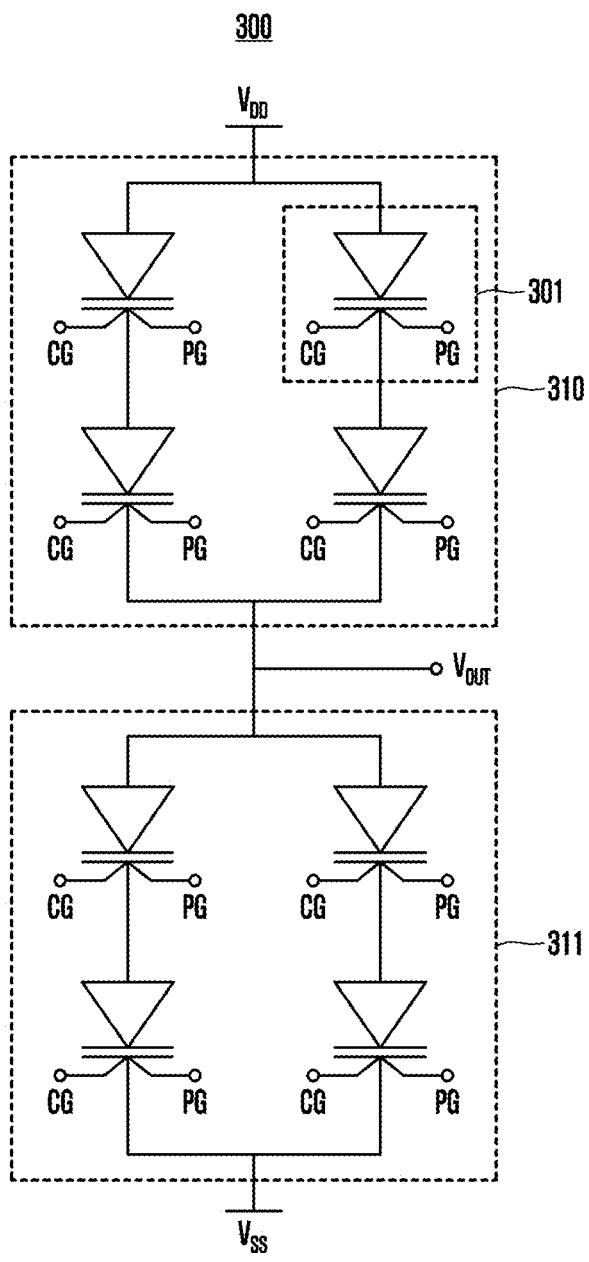
FIG. 3 is a diagram illustrating a universal logic memory cell according to one embodiment of the present disclosure.

FIG. 3 is a diagram illustrating a universal logic memory cell according to one embodiment of the present disclosure.

FIG. 3 illustrates a circuit diagram of a universal logic memory cell including a first network device and a second network device using a plurality of triple-gate silicon devices according to one embodiment of the present disclosure.

Referring to FIG. 3, a universal logic memory cell 300 according to one embodiment of the present disclosure consists of a first network device 310 and a second network device 311, and the first network device 310 and the second network device 311 consist of a plurality of triple-gate silicon devices 301.

More specifically, the first network device 310 and the second network device 311 consist of a first parallel connection formed by connecting common drain regions between a first serial connection in which the drain regions and source regions of two of the four triple-gate silicon devices are connected in series and a second serial connection in which the drain regions and source regions of the remaining two triple-gate silicon devices are connected in series and a second parallel connection formed by connecting common source regions therebetween.

The first network device 310 may be referred to as a pull-up network device, and the second network device 311 may be referred to as a pull-down network device.

According to one embodiment of the present disclosure, the universal logic memory cell 300 performs a memory function of maintaining the state of a preset voltage by controlling a supply voltage, a voltage corresponding to a voltage applied to a program gate electrode, an input voltage applied to a control gate electrode to "0".

According to one embodiment of the present disclosure, the first network device 310 and the second network device 311 each include four triple-gate silicon devices, which may be referred to as two triple-gate silicon devices separated by an upper side, a lower side, a left side, and a right side, or as one triple-gate silicon device separated by an upper left side, an upper right side, a lower left side, and a lower right side.

The triple-gate silicon devices arranged at each location may be selectively driven in either a first channel mode or a second channel mode.

The above-described configuration may be changed depending on the arrangement of network devices, and may be designated in a modified manner depending on the changed connection configuration.

The first network device 310 receives a drain voltage ($V_{DD}$) of a common voltage through the first parallel connection of the first network device 310.

The second network device 311 receives a source voltage ($V_{SS}$) of a common voltage through the second parallel connection of the second network device 311.

In the universal logic memory cell 300 according to one embodiment of the present disclosure, an output voltage ($V_{OUT}$) may be measured at the point where the second parallel connection of the first network device 310 and the first parallel connection of the second network device 311 are connected.

The universal logic memory cell 300 is composed of the first network device 310 and the second network device 311, and implements logical operations based on the measurements of a drain voltage ($V_{DD}$) and a source voltage ($V_{SS}$) at an output voltage ($V_{OUT}$) depending on the operation state of the triple-gate silicon device 301.

The universal logic memory cell 300 according to one embodiment of the present disclosure uses a plurality of triple-gate silicon devices.

Each of the triple-gate silicon devices includes a drain region, a channel region, and a source region, and a supply voltage is applied to the drain region and the source region. Each of the triple-gate silicon devices includes a gate region in which first and second programming gate electrodes and a control gate electrode are formed on the channel region.

In addition, in each of the triple-gate silicon devices, depending on the level of a program voltage ($V_{PG}$) applied through the first and second programming gate electrodes, the channel region under the first and second programming gate electrodes may operate in one of a first channel mode and a second channel mode, and depending on the level of a control voltage ($V_{CG}$) applied through the control gate electrode, the channel region may be determined to be in any one of an on-state and an off-state.

The first network device 310 and the second network device 311 may perform a logic operation function and a memory function according to a predetermined state in a previously performed channel mode.

The logic operation functions are logic operation functions related to NOT, YES, NAND, NOR, AND, OR, XNOR, and XOR gates.

Accordingly, the present disclosure may implement a universal logic memory cell that provides a logic operation function and a memory function using a triple-gate silicon device driven by a positive feedback loop.

In addition, the present disclosure may implement a universal logic memory cell that performs all basic logic operations in a single structure using a triple-gate silicon device and stores the results of operations.

Figure 4A:
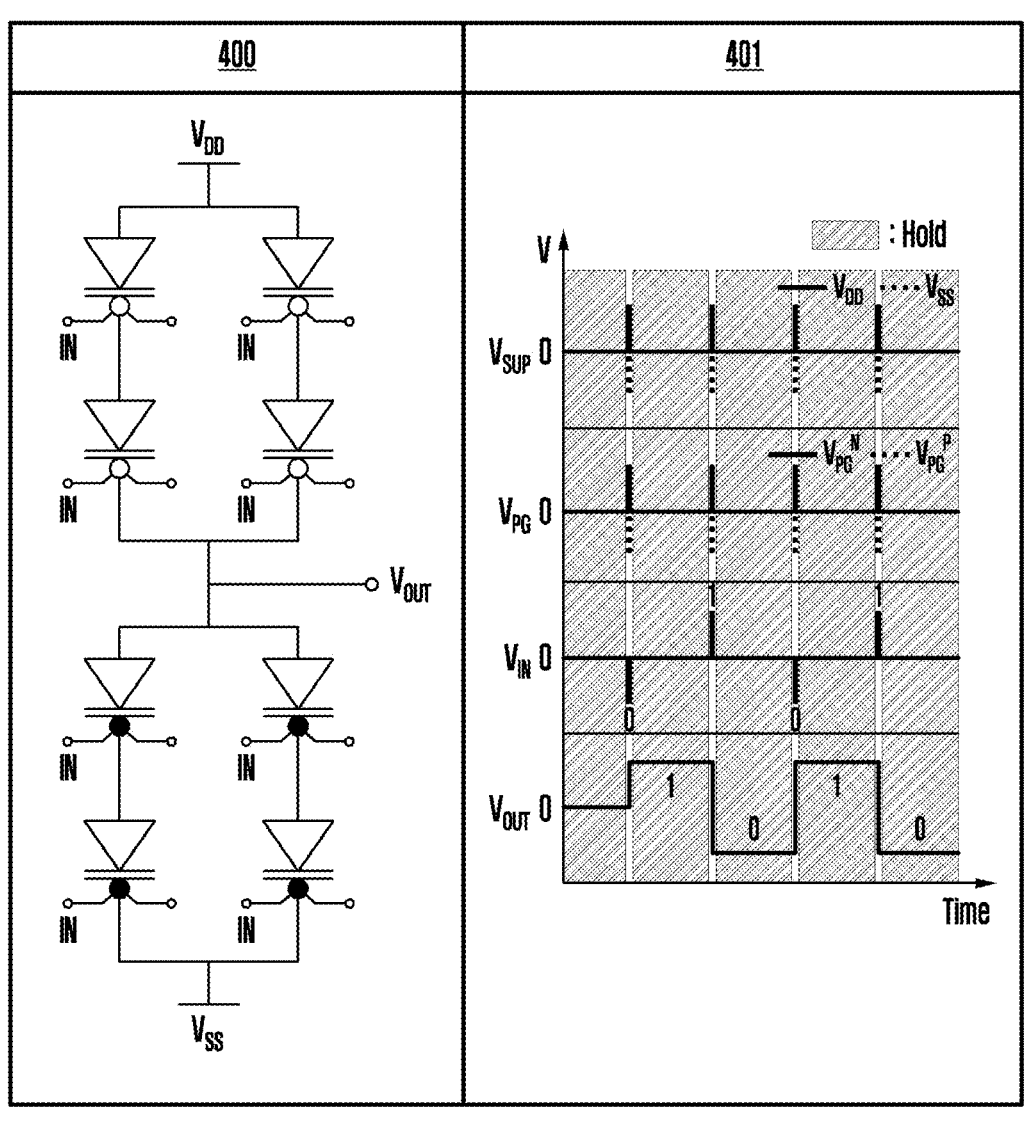
FIGS. 4A to 4E are diagrams illustrating the binary logical operations of a universal logic memory cell according to one embodiment of the present disclosure.

FIG. 4A is a diagram illustrating the NOT gate operation of a universal logic memory cell according to one embodiment of the present disclosure.

FIG. 4A illustrates a circuit diagram and timing diagram for a NOT gate operation of the universal logic memory cell according to one embodiment of the present disclosure.

Referring to FIG. 4A, in a universal logic memory cell 400 according to one embodiment of the present disclosure, triple-gate silicon devices constituting a first network device perform a second channel mode based on a programming voltage applied through a programming gate terminal (PG), and triple-gate silicon devices constituting a second network device perform a first channel mode.

At this time, in the universal logic memory cell 400, when the level of the control voltage ($V_{CG}$), which is the input voltage (IN) applied through the control gate terminal (CG), is a negative level, the level of the output voltage ($V_{OUT}$) measured through the output terminal is a positive level. When the level of the control voltage ($V_{CG}$) is a positive level, a logic operation function corresponding to the NOT gate operation may be performed when the level of the output voltage ($V_{OUT}$) is a negative level.

The timing diagram 401 illustrates that when an input voltage ($V_{IN}$) of a negative level corresponding to "0" is applied, an output voltage ($V_{OUT}$) of a positive level corresponding to "1" is logically operated and output.

In addition, the timing diagram 401 illustrates that when an input voltage ($V_{IN}$) of a positive level corresponding to "1" is applied, an output voltage ($V_{OUT}$) of a negative level corresponding to "0" is logically operated and output.

In addition, a memory function of holding the calculated logic value is performed even when a supply voltage ($V_{SUP}$), a program voltage ($V_{PG}$), and an input voltage ($V_{IN}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}{}^N$) corresponding to the n-channel and the program voltage ($V_{PG}{}^P$) corresponding to the p-channel.

In addition, in the universal logic memory cell, based on a programming voltage applied through the programming gate terminal (PG), the triple-gate silicon devices constituting the first network device may perform a first channel mode, the triple-gate silicon devices constituting the second network device may performs a second channel mode. When the level of a control voltage ($V_{CG}$), which is an input voltage (IN) applied through the control gate terminal (CG), is a positive level, the level of an output voltage ($V_{OUT}$) measured through the output terminal may be a positive level. When the level of a control voltage ($V_{CG}$) is a negative level, the level of an output voltage ($V_{OUT}$) may be a negative level, and a logic operation function corresponding to a YES gate operation may be performed.

Figure 4B:
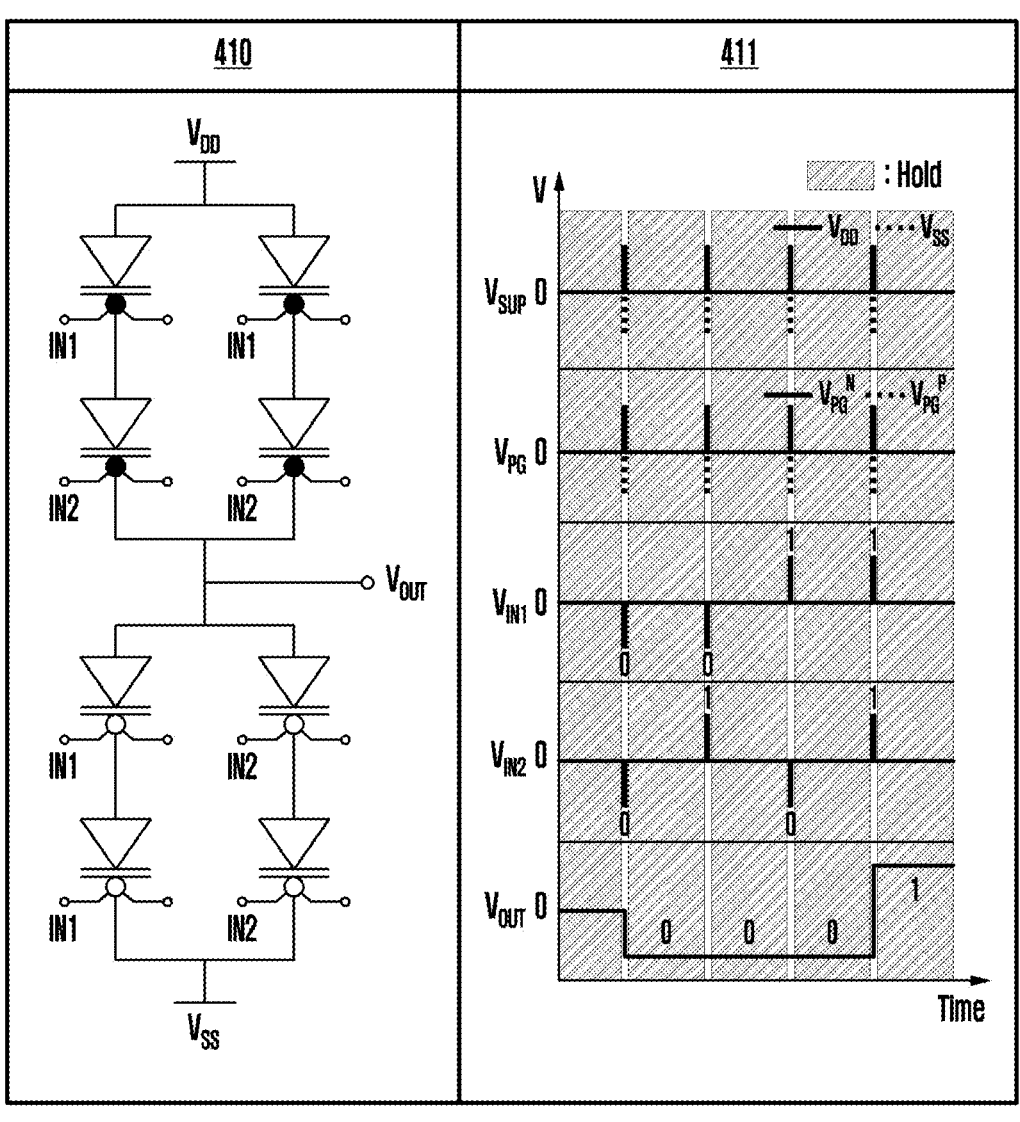

FIG. 4B is a diagram explaining an AND gate operation of the universal logic memory cell according to one embodiment of the present disclosure.

FIG. 4B illustrates a circuit diagram and timing diagram for an AND gate operation of the universal logic memory cell according to one embodiment of the present disclosure.

Referring to FIG. 4B, in a universal logic memory cell 410 according to one embodiment of the present disclosure, based on a programming voltage applied through a programming gate terminal (PG), triple-gate silicon devices constituting a first network device perform a first channel mode, and triple-gate silicon devices constituting a second network device perform a second channel mode.

In addition, in the universal logic memory cell 410, a first control voltage (IN1) of a control voltage ($V_{CG}$) is applied to the upper side of the first network device and the left side of the second network device, and a second control voltage (IN2) of a control voltage ($V_{CG}$) is applied to the lower side of the first network device and the right side of the second network device.

Accordingly, when any one of the levels of a first control voltage ($V_{IN1}$) and a second control voltage ($V_{IN2}$) is a negative level, the universal logic memory cell 410 performs a logical operation of determining the level of an output voltage ($V_{OUT}$) as a negative level.

In addition, when the levels of a first control voltage ($V_{IN1}$) and a second control voltage ($V_{IN2}$) are both positive levels, the universal logic memory cell 410 performs an AND gate operation of determining the level of an output voltage ($V_{OUT}$) as a positive level.

The timing diagram 411 shows that when inputs corresponding to "00", "01", "10", and "11" are applied to two input voltage ($V_{IN1}$, $V_{IN2}$), a binary logic operation function is performed as values corresponding to "0", "0", "0", and "1" are calculated at an output voltage ($V_{OUT}$).

In addition, a memory function is performed to hold the calculated logic values even when a supply voltage ($V_{SUP}$), a program voltage ($V_{PG}$), input voltages ($V_{IN1}$, $V_{IN2}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}{}^N$) corresponding to the n-channel and the program voltage ($V_{PG}{}^P$) corresponding to the p-channel.

Figure 4C:
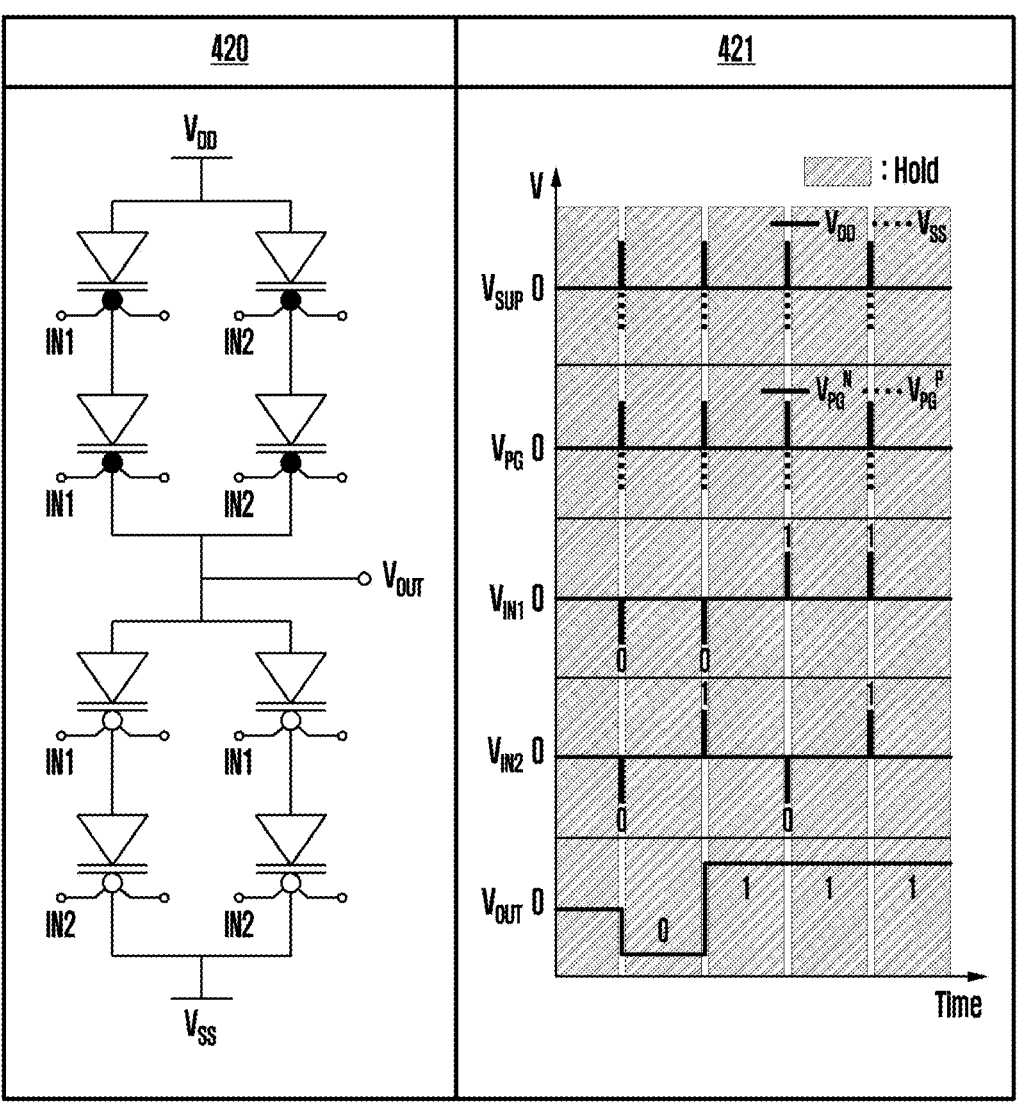

FIG. 4C is a diagram illustrating an OR gate operation of the universal logic memory cell according to one embodiment of the present disclosure.

FIG. 4C illustrates a circuit diagram and timing diagram for an OR gate operation of the universal logic memory cell according to one embodiment of the present disclosure.

Referring to FIG. 4C, in a universal logic memory cell 420 according to one embodiment of the present disclosure, based on a programming voltage applied through the programming gate terminal (PG), the triple-gate silicon devices constituting the first network device perform a first channel mode, and the triple-gate silicon devices constituting the second network device perform a second channel mode.

In addition, in the universal logic memory cell 420, a first control voltage (IN1) of a control voltage ($V_{CG}$) is applied to the left side of the first network device and the upper side of the second network device, and a second control voltage (IN2) of a control voltage ($V_{CG}$) is applied to the right side of the first network device and the lower side of the second network device.

Accordingly, when any one of the levels of a first control voltage ($V_{IN1}$) and a second control voltage ($V_{IN2}$) is a positive level, the universal logic memory cell 420 determines the level of an output voltage ($V_{OUT}$) as a positive level.

In addition, when the levels of a first control voltage ($V_{IN1}$) and a second control voltage ($V_{IN2}$) are both negative levels, the universal logic memory cell 420 determines the level of an output voltage ($V_{OUT}$) as a negative level.

The timing diagram 421 shows that when inputs corresponding to "00", "01", "10", and "11" are applied to two input voltage ($V_{IN1}$, $V_{IN2}$), a binary logic operation function is performed as values corresponding to "0", "1", "1", and "1" are calculated at an output voltage ($V_{OUT}$).

In addition, a memory function is performed to hold the calculated logic values even when a supply voltage ($V_{SUP}$), a program voltage ($V_{PG}$), input voltages ($V_{IN1}$, $V_{IN2}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}{}^N$) corresponding to the n-channel and the program voltage ($V_{PG}{}^P$) corresponding to the p-channel.

Figure 4D:
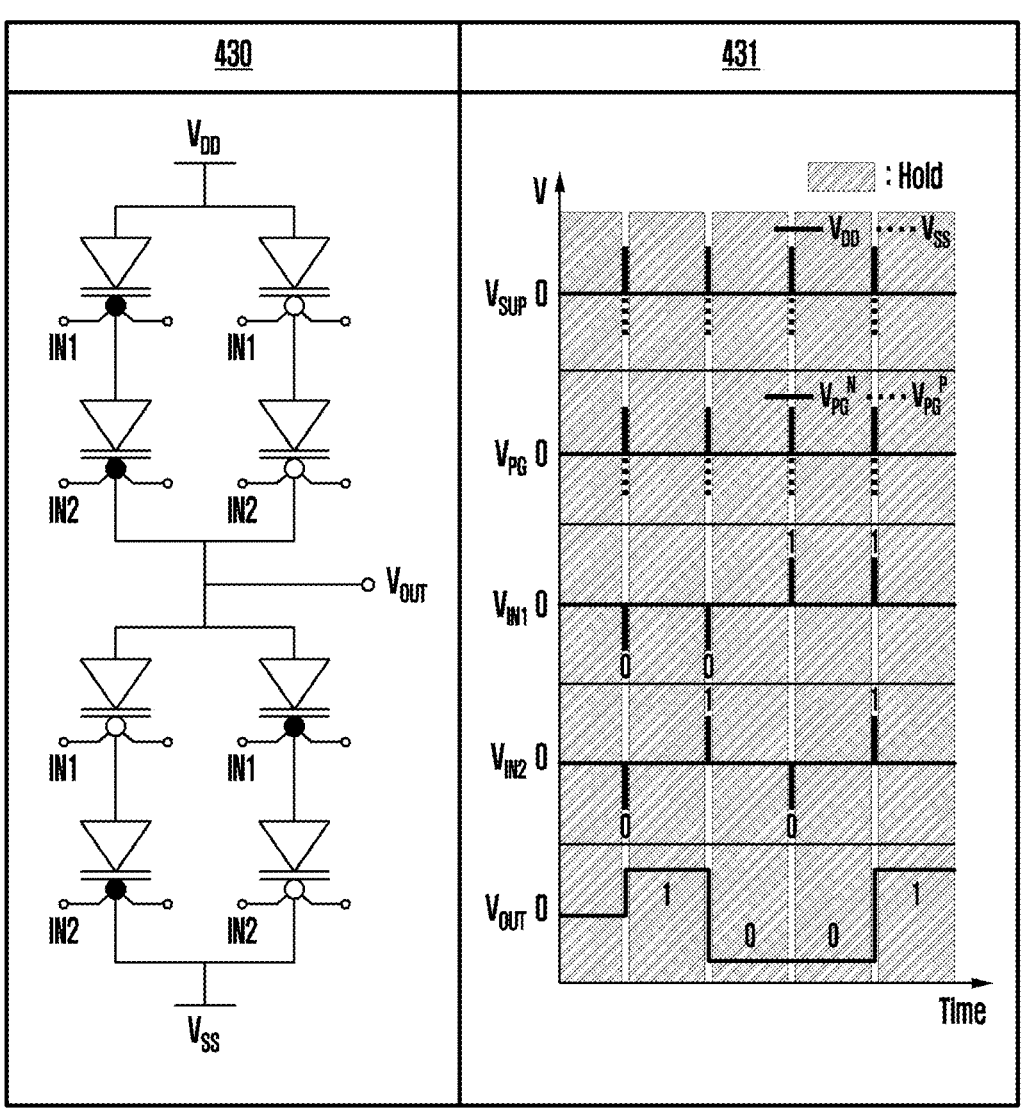

FIG. 4D is a diagram illustrating an XNOR gate operation of the universal logic memory cell according to one embodiment of the present disclosure.

FIG. 4D illustrates a circuit diagram and timing diagram for an XNOR gate operation of the universal logic memory cell according to one embodiment of the present disclosure.

Referring to FIG. 4D, in a universal logic memory cell 430 according to one embodiment of the present disclosure, the left side of the triple-gate silicon devices constituting the first network device performs a first channel mode, and the right side thereof performs a second channel mode. The upper left side of the triple-gate silicon devices constituting the second network device performs a second channel mode, the upper right side thereof performs a first channel mode, the lower left side thereof performs a first channel mode, and the lower right side thereof performs a second channel mode.

In the universal logic memory cell 430 according to one embodiment of the present disclosure, a first control voltage ($V_{IN1}$) of a control voltage ($V_{CG}$) is applied to the upper side of the first and second network devices, and a second control voltage ($V_{IN2}$) of a control voltage ($V_{CG}$) is applied to the lower side of the first and second network devices.

According to one embodiment of the present disclosure, the universal logic memory cell 430 may output the level of an output voltage ($V_{OUT}$) as a positive level when the levels of a first control voltage ($V_{IN1}$) and a second control voltage ($V_{IN2}$) are the same, and may perform an XNOR logic operation function of determining the level of an output voltage ($V_{OUT}$) as a negative level when the levels of a first control voltage ($V_{IN1}$) and a second control voltage ($V_{IN2}$) are different.

The timing diagram 431 shows that when inputs corresponding to "00", "01", "10", and "11" are applied to two input voltage ($V_{IN1}$, $V_{IN2}$), a binary logic operation function is performed as values corresponding to "1", "0", "0", and "1" are calculated at an output voltage ($V_{OUT}$).

In addition, a memory function is performed to hold the calculated logic values even when a supply voltage ($V_{SUP}$), a program voltage ($V_{PG}$), input voltages ($V_{IN1}$, $V_{IN2}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}^N$) corresponding to the n-channel and the program voltage ($V_{PG}^P$) corresponding to the p-channel.

Figure 4E:
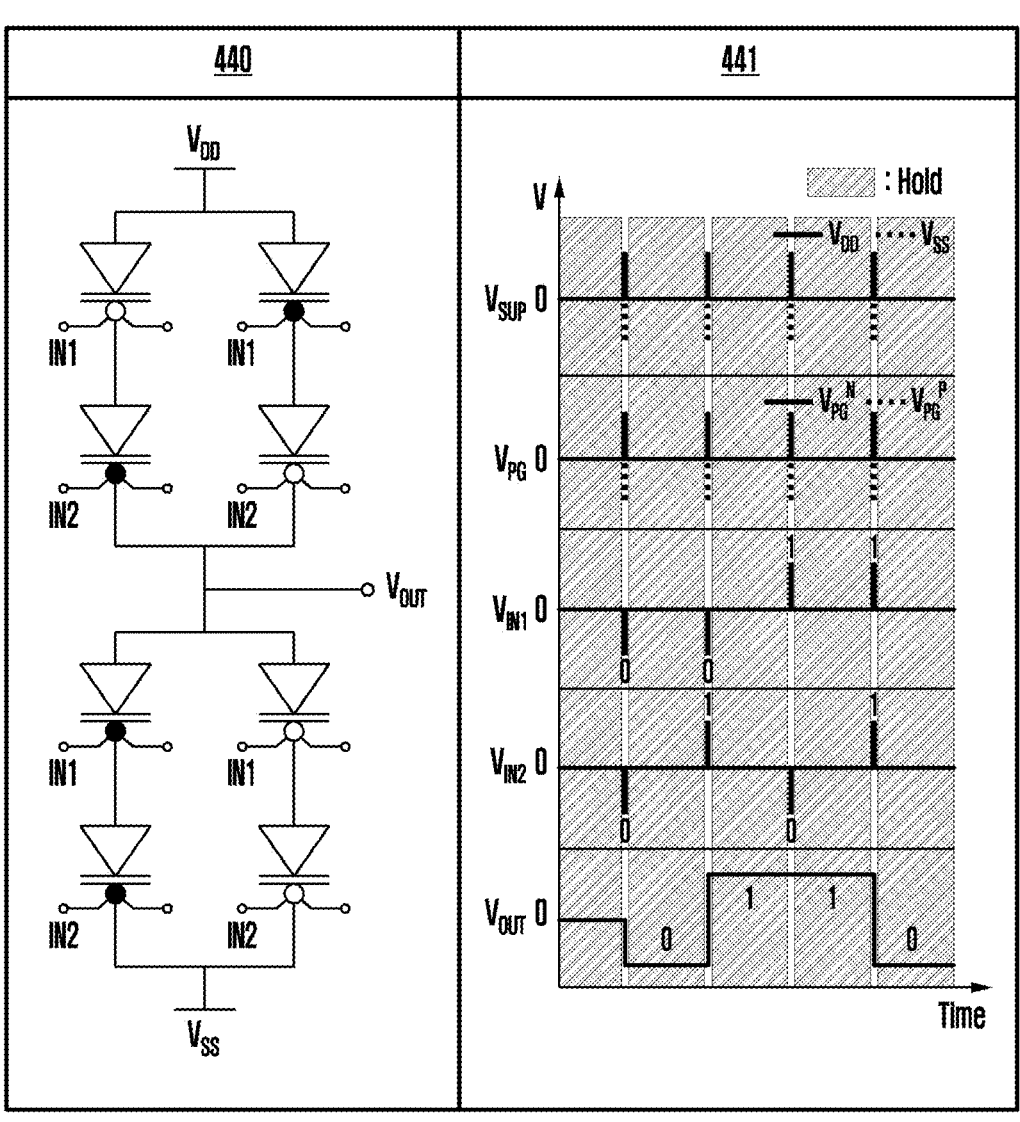

FIG. 4E is a diagram illustrating an XOR gate operation of the universal logic memory cell according to one embodiment of the present disclosure.

FIG. 4E illustrates a circuit diagram and timing diagram for an XOR gate operation of the universal logic memory cell according to one embodiment of the present disclosure.

Referring to FIG. 4E, in a universal logic memory cell 440 according to one embodiment of the present disclosure, the upper left side of the triple-gate silicon devices constituting the first network device performs a second channel mode, the upper right side thereof performs a first channel mode, the lower left side thereof performs a first channel mode, and the lower right side thereof performs a second channel mode. The left side of the triple-gate silicon devices constituting the second network device performs a first channel mode, and the right side thereof performs a second channel mode.

In the universal logic memory cell 440 according to one embodiment of the present disclosure, a first control voltage ($V_{IN1}$) of a control voltage ($V_{CG}$) is applied to the upper side of the first and second network devices, and a second control voltage ($V_{IN2}$) of a control voltage ($V_{CG}$) is applied to the lower side of the first and second network devices.

For example, the universal logic memory cell 440 determines the level of an output voltage ($V_{OUT}$) as a negative level when the levels of a first control voltage ($V_{IN1}$) and a second control voltage ($V_{IN2}$) are both positive or negative levels.

In addition, the universal logic memory cell 440 outputs the level of an output voltage ($V_{OUT}$) as a positive level when the levels of a first control voltage ($V_{IN1}$) and a second control voltage ($V_{IN2}$) are different.

The timing diagram 441 shows that when inputs corresponding to "00", "01", "10", and "11" are applied to two input voltage ($V_{IN1}$, $V_{IN2}$), a binary logic operation function is performed as values corresponding to "0", "1", "1", and "0" are calculated at an output voltage ($V_{OUT}$). In addition, a memory function is performed to hold the calculated logic values even when a supply voltage ($V_{SUP}$), a program voltage ($V_{PG}$), input voltages ($V_{IN1}$, $V_{IN2}$) are removed.

For example, the supply voltage ($V_{SUP}$) consists of the drain voltage ($V_{DD}$) and the source voltage ($V_{SS}$), and the program voltage ($V_{PG}$) consists of the program voltage ($V_{PG}^N$) corresponding to the n-channel and the program voltage ($V_{PG}^P$) corresponding to the p-channel.

Accordingly, the present disclosure may improve processing speed and integration limitation due to data bottleneck through the fusion of logical operation and storage function.

In addition, the present disclosure shows that standby power efficiency may be improved with excellent memory characteristics that maintain logical operation values without structural changes and external biases by using channel type variable characteristics.

Figure 5:
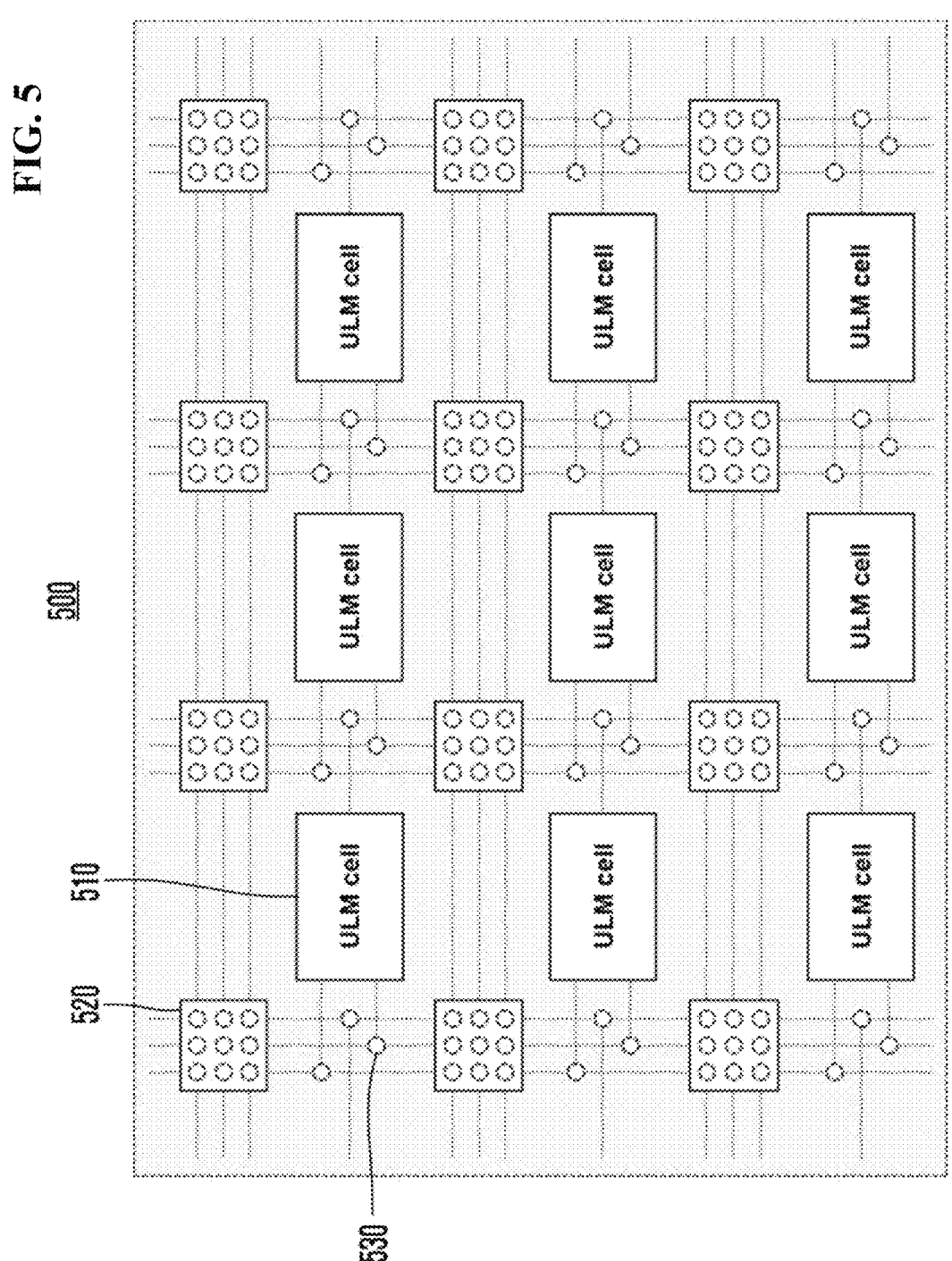
FIG. 5 is a diagram illustrating a universal logic memory block using a plurality of universal logic memory cells according to one embodiment of the present disclosure.

FIG. 5 is a diagram illustrating a universal logic memory block using a plurality of universal logic memory cells according to one embodiment of the present disclosure.

FIG. 5 illustrates the components of the universal logic memory block using a plurality of universal logic memory cells according to one embodiment of the present disclosure.

Referring to FIG. 5, according to one embodiment of the present disclosure, a universal logic memory block 500 includes the universal logic memory cell 510 including first and second network devices using a plurality of triple-gate silicon devices, and is implemented using a plurality of universal logic memory cells 510.

For example, a switch box 520 may determine the directions of an input voltage applied to the universal logic memory cell and an output voltage output from the universal logic memory cell 510.

A line switch 530 according to one embodiment of the present disclosure controls interconnection between the switch box 520 and the universal logic memory cell 510.

According to one embodiment of the present disclosure, the universal logic memory block 500 may perform a combination logic operation function and memory function according to interconnection control for the logic operation function of the universal logic memory cell 510 according to the directions of the determined input voltage and output voltage in a structure in which the universal logic memory cell 510 is arranged in multiples according to preset settings.

For example, in the universal logic memory block 500, the universal logic memory cells 510 are arranged in a plurality of rows and columns according to preset settings, and the switch box 520 and the line switch 530 are arranged between the universal logic memory cells 510.

In the universal logic memory block 500, the number of line switches 530 is determined to correspond to the number of input voltages transmitted through the switch box 520, and a combination logic operation function is implemented with at least one output based on an output voltage.

In the universal logic memory block 500, various combination logic operation functions may be implemented in a single structure since the universal logic memory cell 510 selectively implements a binary logic operation function.

The combination logic operation function is implemented through a combination of logic operation functions involving NOT, YES, NAND, NOR, AND, OR, XNOR, and XOR gates based on the binary logic operation function.

The combination logic operation function may include half adder operation, full adder operation, demultiplexer operation, multiplexer operation, encoder operation, bit comparator operation, bit binary-to-gray code converter operation, and the like.

In addition to the combination logic operation functions described above, the universal logic memory block 500 may implement various combinations of logical operations in a single structure.

Since combinational logical operations are performed in a structure where basic logic operations are arranged sequentially, and since the structure is designed so that interconnection between the input/output ports of each cell is possible, when an input voltage is applied, various combinational logical operations may be performed depending on the logic gate type and connection method of each cell, and the results of the performed operations may be remembered.

Accordingly, the present disclosure may implement a universal logic memory cell using a triple-gate silicon device, which is a silicon-based feedback memory device using a conventional CMOS process, and may implement a universal logic memory block using the universal logic memory cell that performs binary combinational logical operations and memorizes the operation results.

Figure 6:
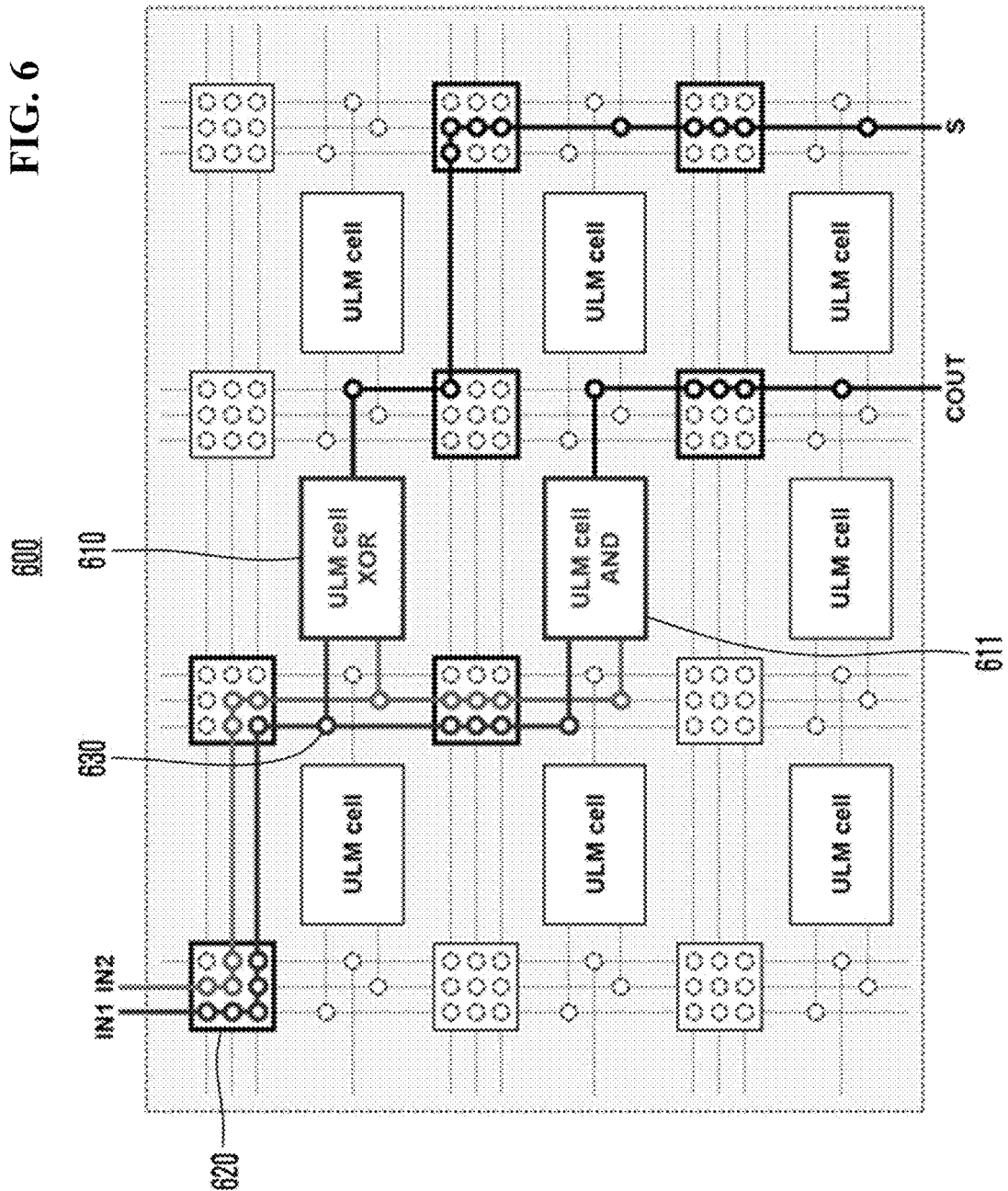
FIGS. 6 and 7 are diagrams illustrating the half adder operation of a universal logic memory block according to one embodiment of the present disclosure.
Figure 7:
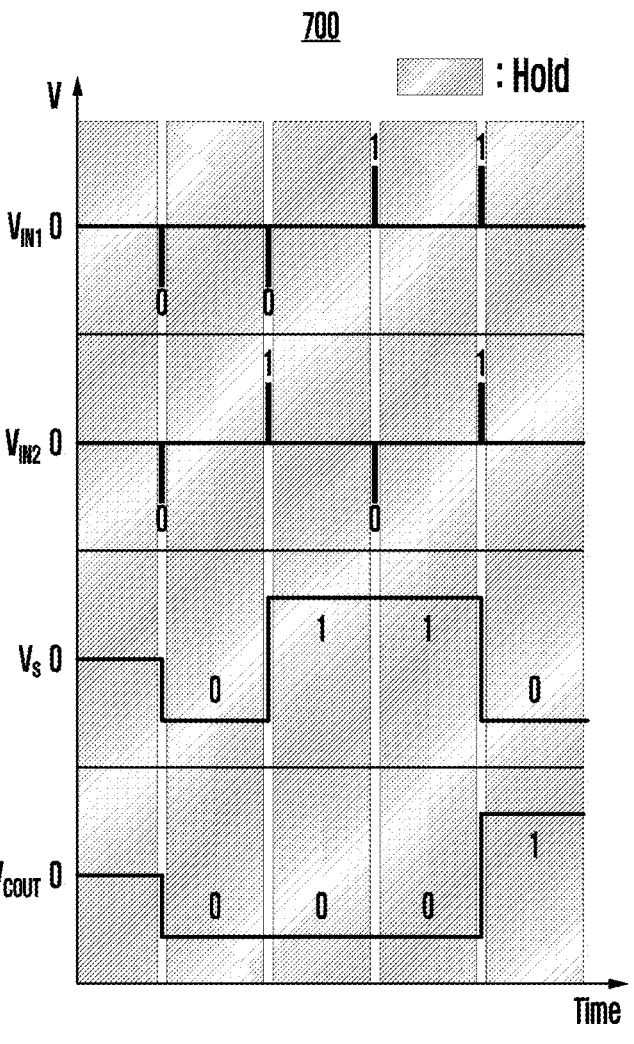

FIGS. 6 and 7 are diagrams illustrating the half adder operation of a universal logic memory block according to one embodiment of the present disclosure.

FIG. 6 illustrates a structure associated with a half adder operation of the universal logic memory block according to one embodiment of the present disclosure.

Referring to FIG. 6, a universal logic memory block 600 according to one embodiment of the present disclosure implements a half adder operation based on the control of a switch box 620 and a line switch 630 for a universal logic memory cell 610 operating as an XOR gate and a universal logic memory cell 611 operating as an AND gate.

The switch box 620 applies a first input voltage ($V_{IN1}$) and a second input voltage ($V_{IN2}$) to the universal logic memory cell 610 operating as an XOR gate and the universal logic memory cell 611 operating as an AND gate, among logic operation functions, among the universal logic memory cells arranged in a plurality of rows and columns.

In addition, the switch box 620 outputs, as a sum(S), an output from the universal logic memory cell 610 operating as an XOR gate, and outputs, as a carry digit (COUT), an output from the universal logic memory cell 611 operating as an AND gate.

FIG. 7 illustrates a timing diagram associated with a half adder operation of the universal logic memory block according to one embodiment of the present disclosure.

Referring to FIG. 7, a timing diagram 700 according to one embodiment of the present disclosure shows the half adder operation of the universal logic memory block that derives operation results as a sum(S) and a carry digit (COUT) for a first input voltage ($V_{IN1}$) and a second input voltage ($V_{IN2}$).

The universal logic memory block 600 outputs a logical operation value corresponding to a half adder according to the distribution of input/output voltages, and performs a memory function that maintains operation results even when all voltages are removed.

Figure 8:
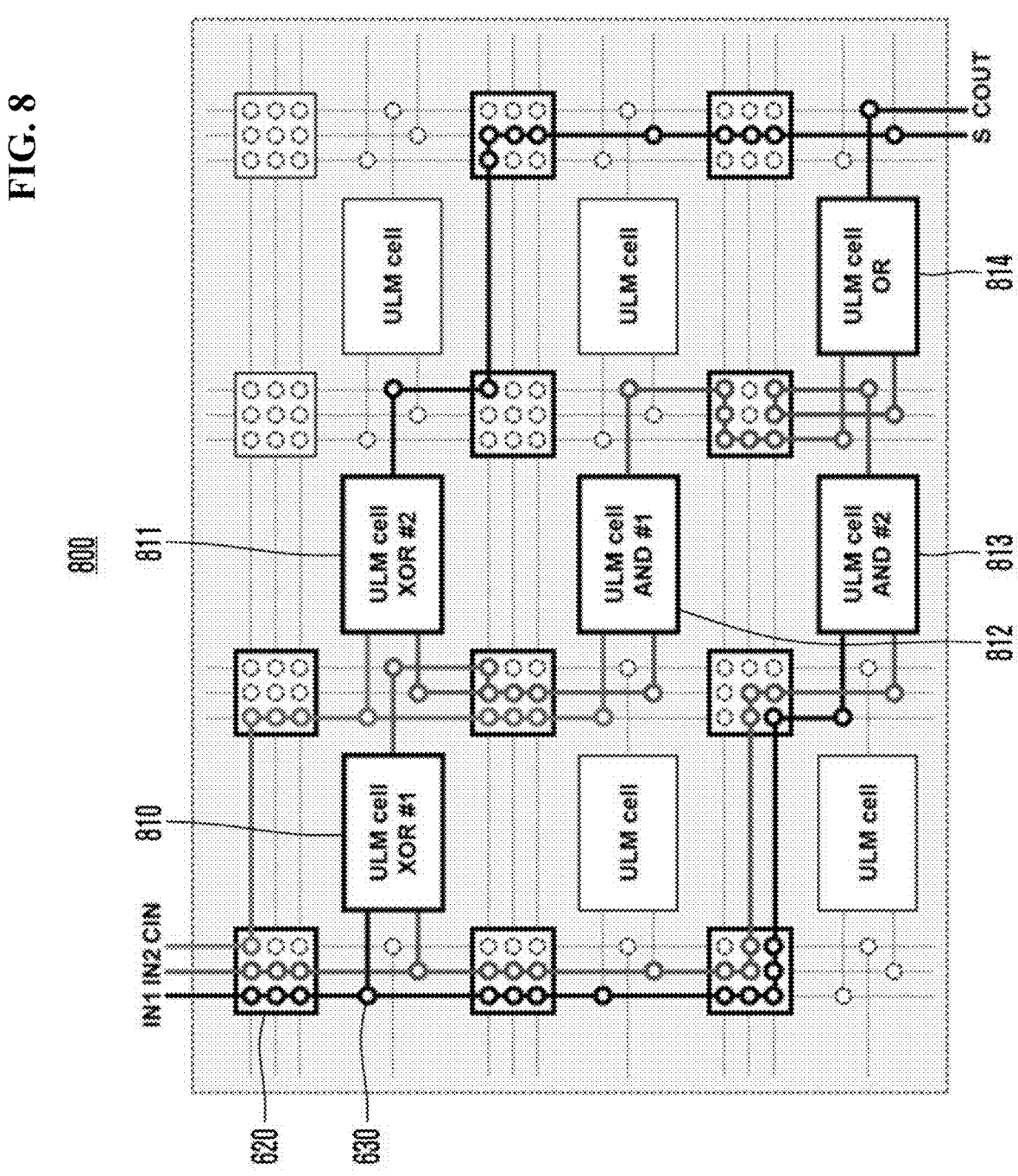
FIGS. 8 and 9 are diagrams illustrating the full adder operation of a universal logic memory block according to one embodiment of the present disclosure.
Figure 9:
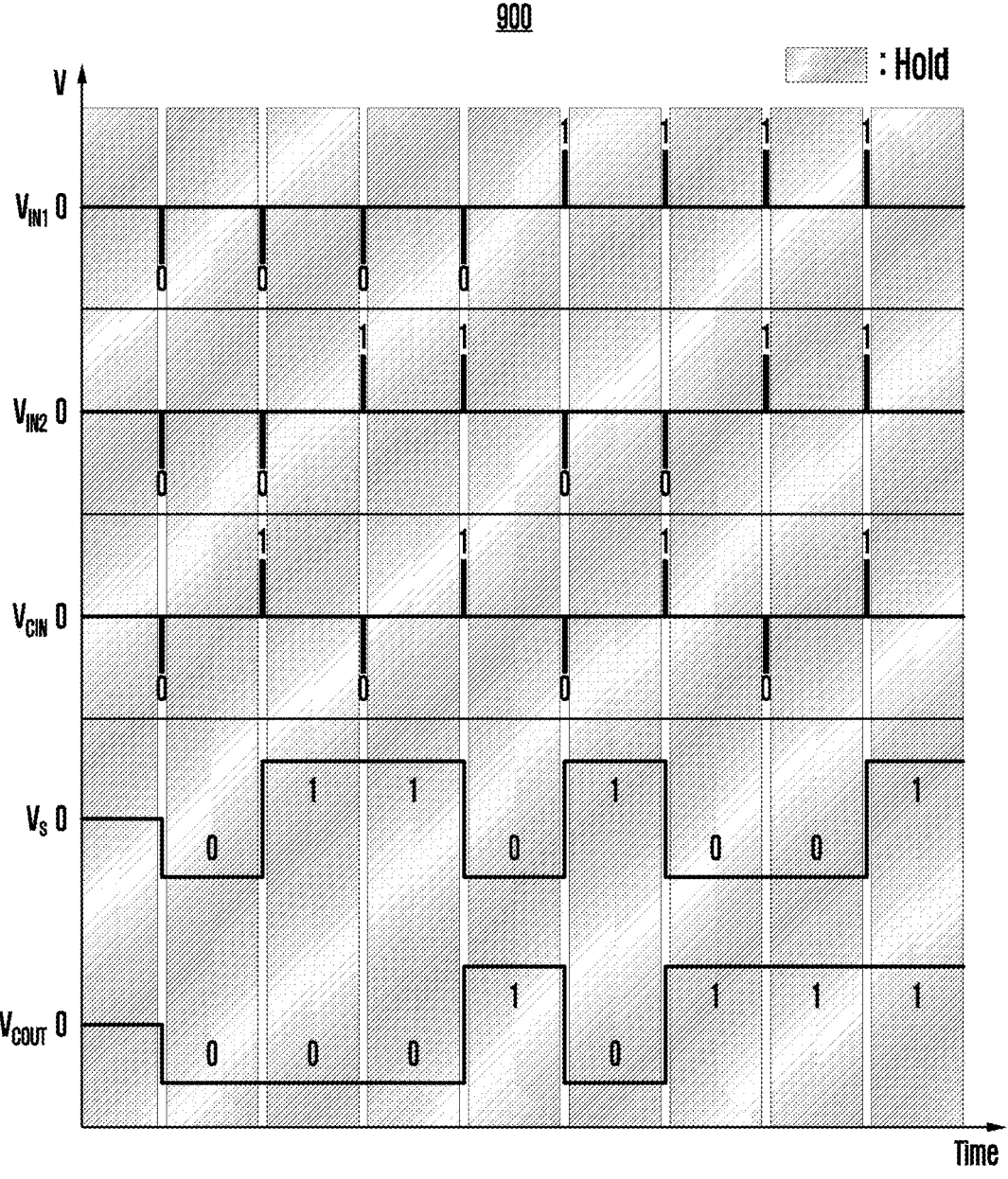

FIGS. 8 and 9 are diagrams illustrating the full adder operation of a universal logic memory block according to one embodiment of the present disclosure.

FIG. 8 illustrates a structure associated with a full adder operation of the universal logic memory block according to one embodiment of the present disclosure.

Referring to FIG. 8, a universal logic memory block 800 according to one embodiment of the present disclosure implements a full adder operation based on control of a switch box 820 and a line switch 830 for the universal logic memory cells operating as a first XOR gate 810 and a second XOR gate 811, the universal logic memory cells operating as a first AND gate 812 and a second AND gate 813, and the universal logic memory cells operating as an OR gate 814.

For example, the switch box 820 applies a first input voltage ($V_{IN1}$), a second input voltage ($V_{IN2}$), and a third input voltage ($V_{CIN}$) to the universal logic memory cells operating as the first XOR gate 810 and the second XOR gate 811 and the universal logic memory cells operating as the first AND gate 812 and the second AND gate 813, among logic operation functions, among the universal logic memory cells arranged in a plurality of rows and columns.

In addition, the switch box 820 outputs, as a sum(S), an output from the universal logic memory cell operating as the second XOR gate 811, and transfers outputs from the universal logic memory cells operating as the first AND gate 812 and the second AND gate 813 to inputs of the universal logic memory cell operating as the OR gate 814 and then outputs an output voltage as a carry digit (COUT).

FIG. 9 illustrates a timing diagram associated with a full adder operation of the universal logic memory block according to one embodiment of the present disclosure.

Referring to FIG. 9, a timing diagram 900 according to one embodiment of the present disclosure shows a full adder operation of the universal logic memory block that derives operation results as a sum(S) and a carry digit (COUT) for a first input voltage ($V_{IN1}$), a second input voltage ($V_{IN2}$), and a third input voltage ($V_{CIN}$).

The universal logic memory block 800 outputs a logical operation value corresponding to a full adder according to the distribution of input/output voltages, and performs a memory function that maintains the operation results even when all voltages are removed.

Figure 10:
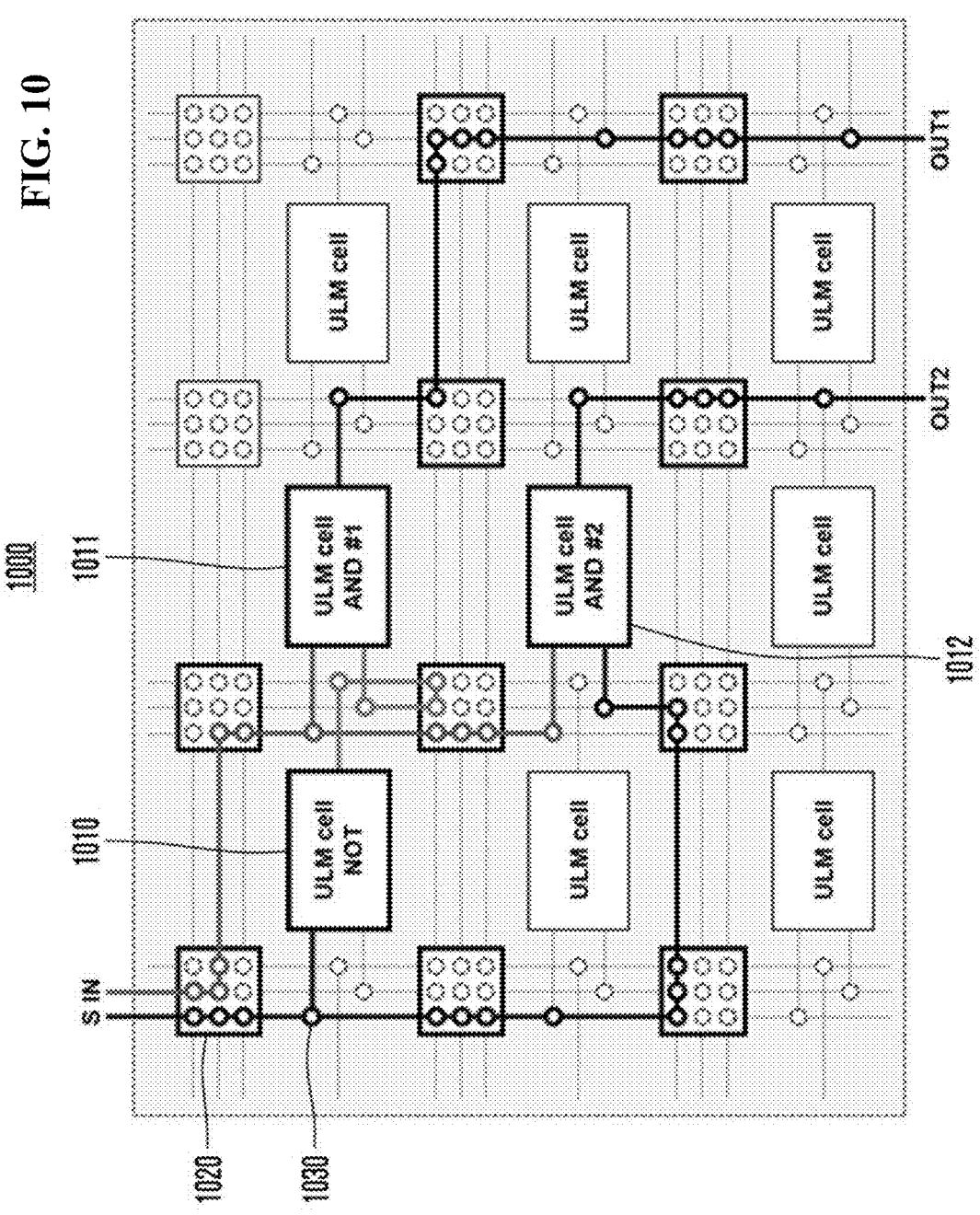
FIGS. 10 and 11 are diagrams illustrating the demultiplexer operation of a universal logic memory block according to one embodiment of the present disclosure.
Figure 11:
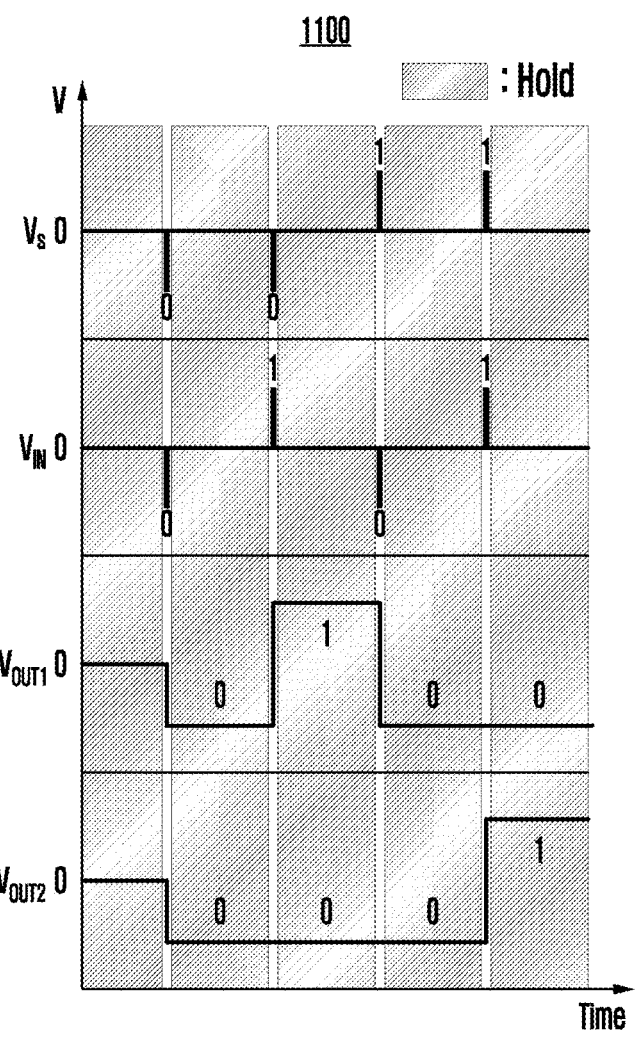

FIGS. 10 and 11 are diagrams illustrating the demultiplexer operation of a universal logic memory block according to one embodiment of the present disclosure.

FIG. 10 illustrates a structure associated with a demultiplexer operation of the universal logic memory block according to one embodiment of the present disclosure.

Referring to FIG. 10, a universal logic memory block 1000 according to one embodiment of the present disclosure implements a demultiplexer operation based on the control of a switch box 1020 and a line switch 1030 for the universal logic memory cells operating as a first AND gate 1011 and a second AND gate 1012 and the universal logic memory cell operating as an NOT gate 1010.

For example, the switch box 1020 applies an input voltage ($V_{IN}$) to the universal logic memory cells operating as the first AND gate 1011 and the second AND gate 1012 among the universal logic memory cells arranged in a plurality of rows and columns.

In addition, the switch box 1020 applies a selection voltage ($V_S$) to the universal logic memory cell operating as the NOT gate 1010 among logic operation functions.

Accordingly, the switch box 1020 outputs an output from the universal logic memory cell operating as the first AND gate 1011 as a first output (OUT1), and outputs an output from the universal logic memory cell operating as the second AND gate 1012 as a second output (OUT2).

FIG. 11 illustrates a timing diagram associated with a demultiplexer operation of the universal logic memory block according to one embodiment of the present disclosure.

Referring to FIG. 11, a timing diagram 1100 according to one embodiment of the present disclosure shows a demultiplexer operation according to the order of outputting a first output (OUT1) and a second output (OUT2) for an input voltage ($V_{IN}$) and a selection voltage ($V_S$).

The universal logic memory block 1000 outputs a logical operation value corresponding to a demultiplexer according to the distribution of input/output voltages, and performs a memory function that maintains the operation results even when all voltages are removed.

Figure 12:
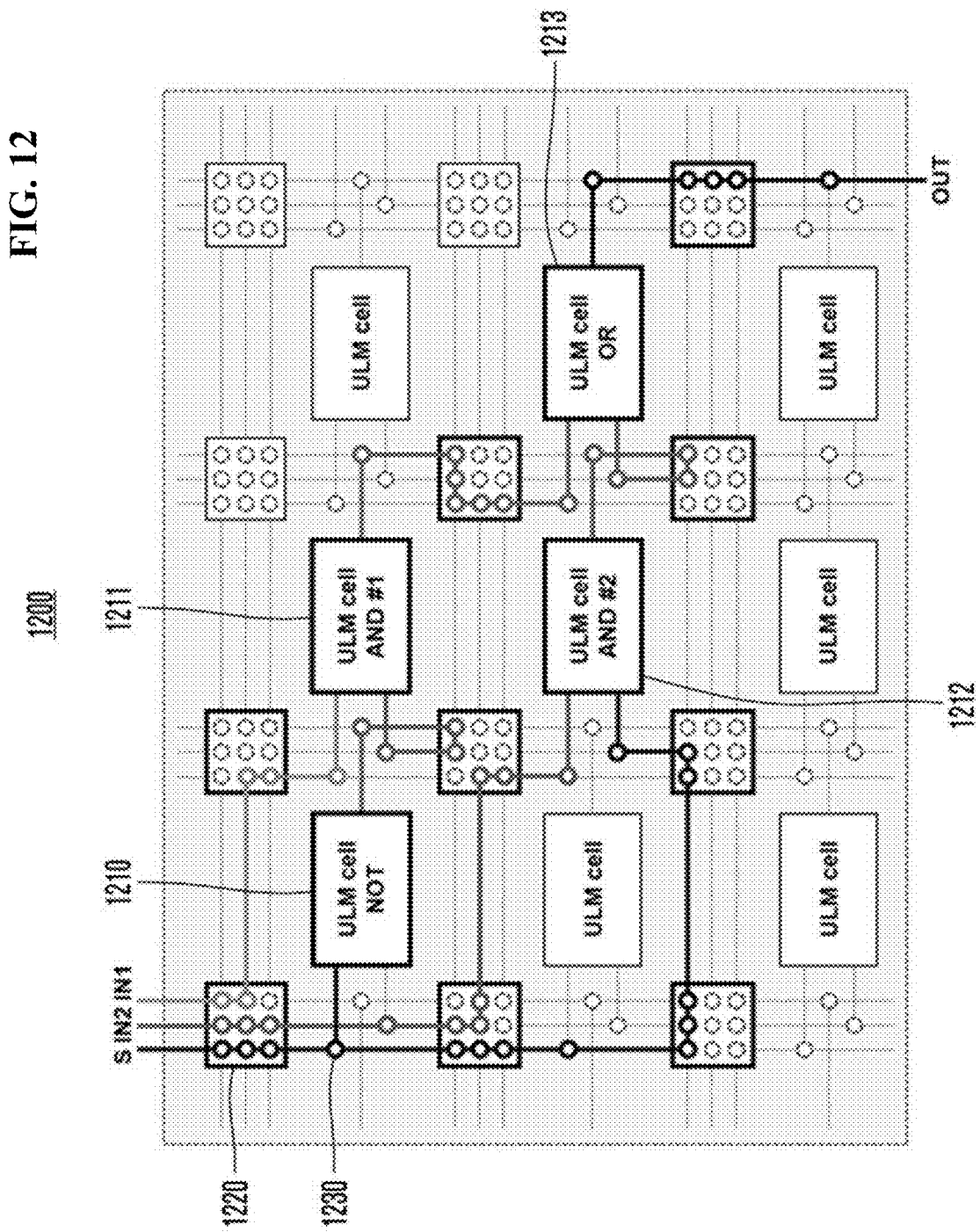
FIGS. 12 and 13 are diagrams illustrating the multiplexer operation of a universal logic memory block according to one embodiment of the present disclosure.
Figure 13:
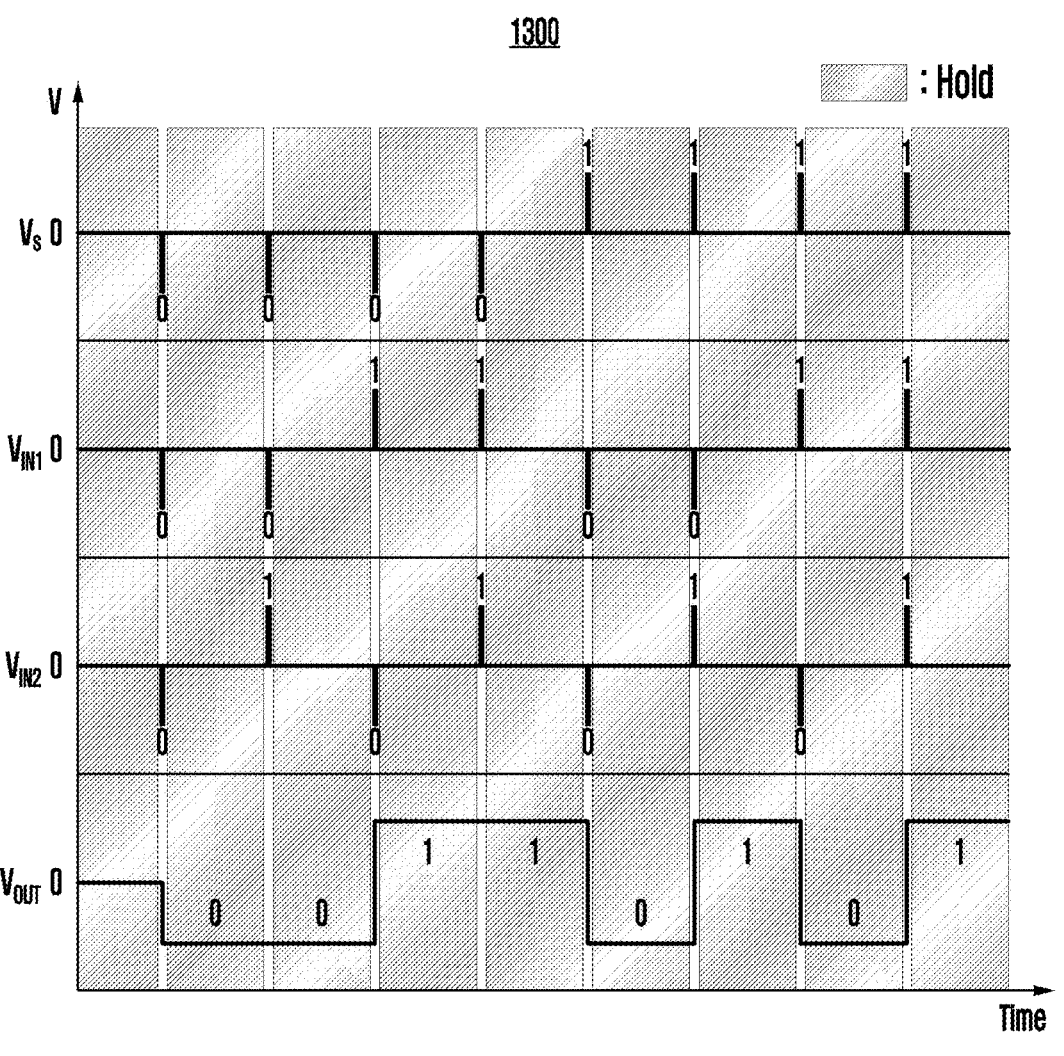

FIGS. 12 and 13 are diagrams illustrating the multiplexer operation of a universal logic memory block according to one embodiment of the present disclosure.

FIG. 12 illustrates a structure related to a 2*1 multiplexer operation of the universal logic memory block according to one embodiment of the present disclosure.

Referring to FIG. 12, a universal logic memory block 1200 according to one embodiment of the present disclosure implements a 2*1 multiplexer operation based on the control of a switch box 1220 and a line switch 1230 for the universal logic memory cells operating as a first AND gate 1211 and a second AND gate 1212, the universal logic memory cell operating as an NOT gate 1210, and the universal logic memory cell operating as an OR gate 1213.

For example, the switch box 1220 applies a first input voltage ($V_{IN1}$) and a second input voltage ($V_{IN2}$) to the universal logic memory cells operating as the first AND gate 1211 and the second AND gate 1212 among the universal logic memory cells arranged in a plurality of rows and columns.

The switch box 1220 according to one embodiment of the present disclosure applies a selection voltage ($V_S$) to the universal logic memory cell operating as the NOT gate 1210 among logic operation functions.

For example, the switch box 1220 transfers an output from the universal logic memory cell operating as the first AND gate 1211 and an output from the universal logic memory cell operating as the second AND gate 1212 to inputs of the universal logic memory cell operating as the OR gate 1213, and outputs an output voltage as an output (OUT).

FIG. 13 illustrates a timing diagram related to a 2*1 multiplexer operation of the universal logic memory block according to one embodiment of the present disclosure.

Referring to FIG. 13, a timing diagram 1300 according to one embodiment of the present disclosure shows a multiplexer operation according to the order in which a first input voltage ($V_{IN1}$), a second input voltage ($V_{IN2}$), and a selection voltage ($V_S$) are output as an output (OUT).

The universal logic memory block 1200 outputs a logical operation value corresponding to a 2*1 multiplexer according to the distribution of input/output voltages, and performs a memory function that maintains the operation results even when all voltages are removed.

Figure 14:
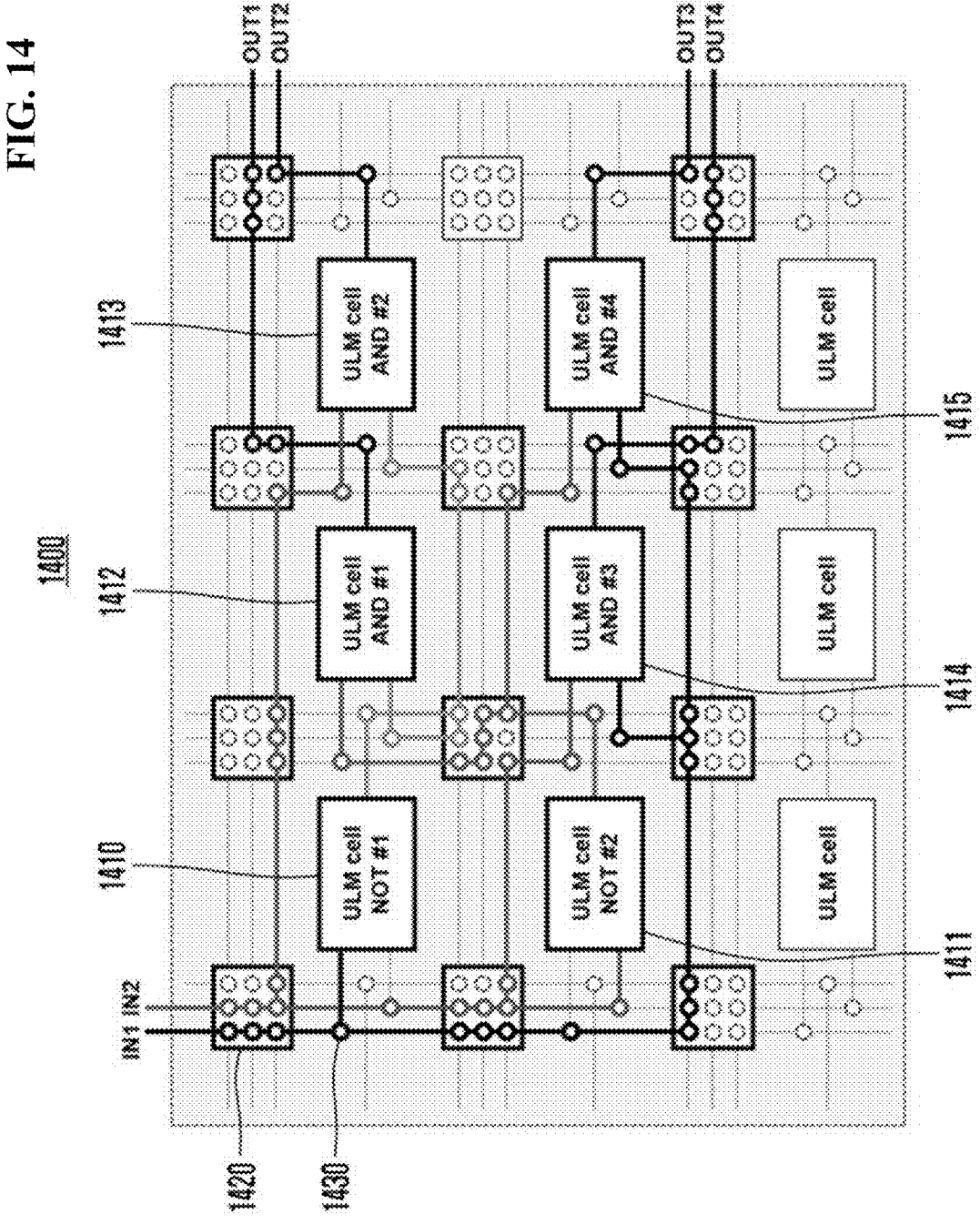
FIGS. 14 and 15 are diagrams illustrating the decoder operation of a universal logic memory block according to one embodiment of the present disclosure.
Figure 15:
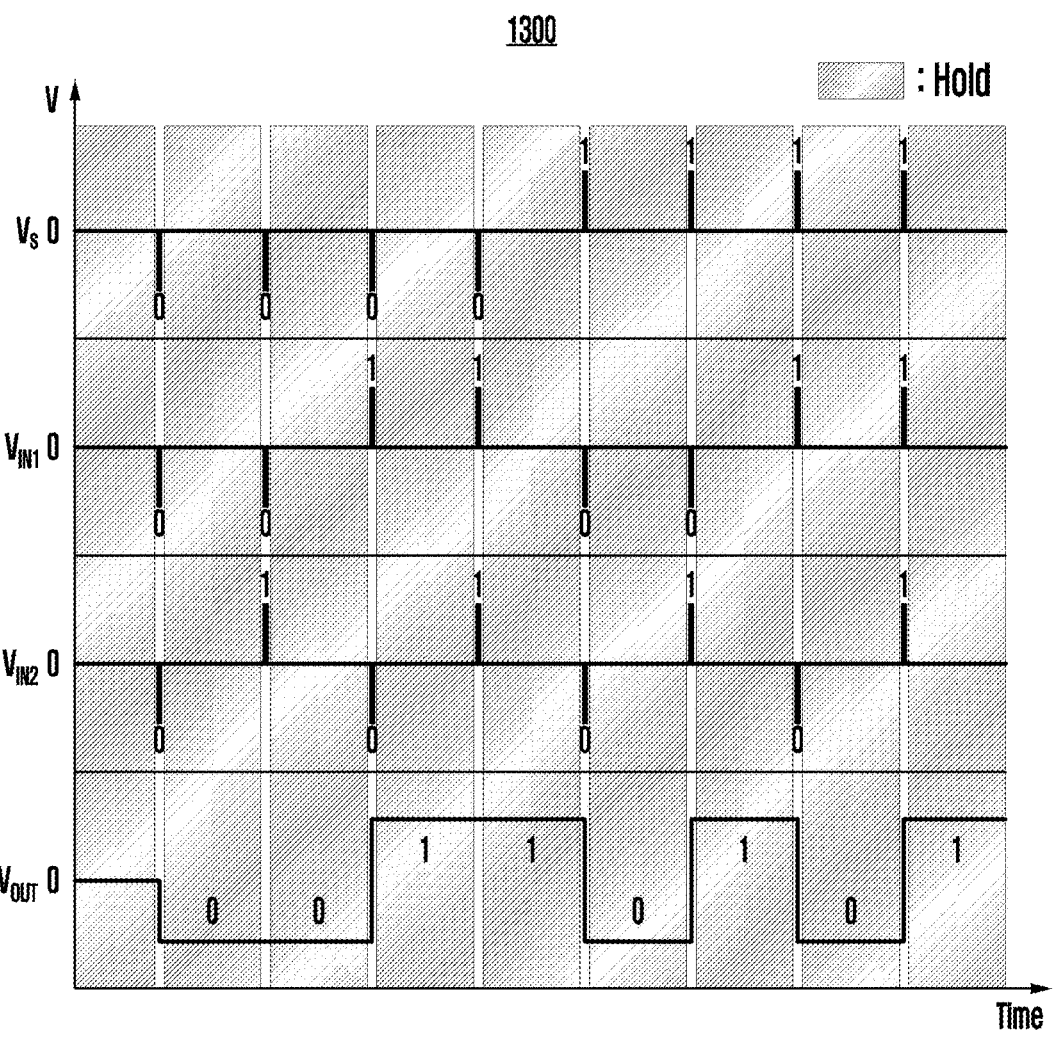

FIGS. 14 and 15 are diagrams illustrating the decoder operation of a universal logic memory block according to one embodiment of the present disclosure.

FIG. 14 illustrates a structure associated with a decoder operation of the universal logic memory block according to one embodiment of the present disclosure.

Referring to FIG. 14, a universal logic memory block 1400 according to one embodiment of the present disclosure implements a 2*4 decoder operation based on the control of a switch box 1420 and a line switch 1430 for the universal logic memory cells operating as a first NOT gate 1410 and a second NOT gate 1411 and the universal logic memory cells operating as a first AND gate 1412, a second AND gate 1413, a third AND gate 1414, and a fourth AND gate 1415.

For example, the switch box 1420 selectively applies a first input voltage ($V_{IN1}$) and a second input voltage ($V_{IN2}$) to the universal logic memory cells operating as the first AND gate 1412, the second AND gate 1413, the third AND gate 1414, and the fourth AND gate 1415 and the universal logic memory cells operating as the first NOT gate 1410 and the second NOT gate 1411, among logic operation functions, among the universal logic memory cells arranged in a plurality of rows and columns.

The switch box 1420 controls the output of the universal logic memory cell operating as the first AND gate 1412 as a first output (OUT1), controls the output of the universal logic memory cell operating as the second AND gate 1413 as a second output (OUT2), controls the output of the universal logic memory cell operating as the third AND gate

1414 as a fourth output (OUT4), and controls the output of the universal logic memory cell operating as the fourth AND gate 1415 as a third output (OUT3).

FIG. 15 illustrates a timing diagram related to a decoder operation of the universal logic memory block according to one embodiment of the present disclosure.

Referring to FIG. 15, a timing diagram 1500 according to one embodiment of the present disclosure shows a decoder operation according to the order in which a first input voltage ($V_{IN1}$) and a second input voltage ($V_{IN2}$) are output as a first output (OUT1), a second output (OUT2), a third output (OUT3), and a fourth output (OUT4).

The universal logic memory block outputs a logical operation value corresponding to a 2*4 decoder according to the distribution of input/output voltages, and performs a memory function that maintains the operation results even when all voltages are removed.

Figure 16:
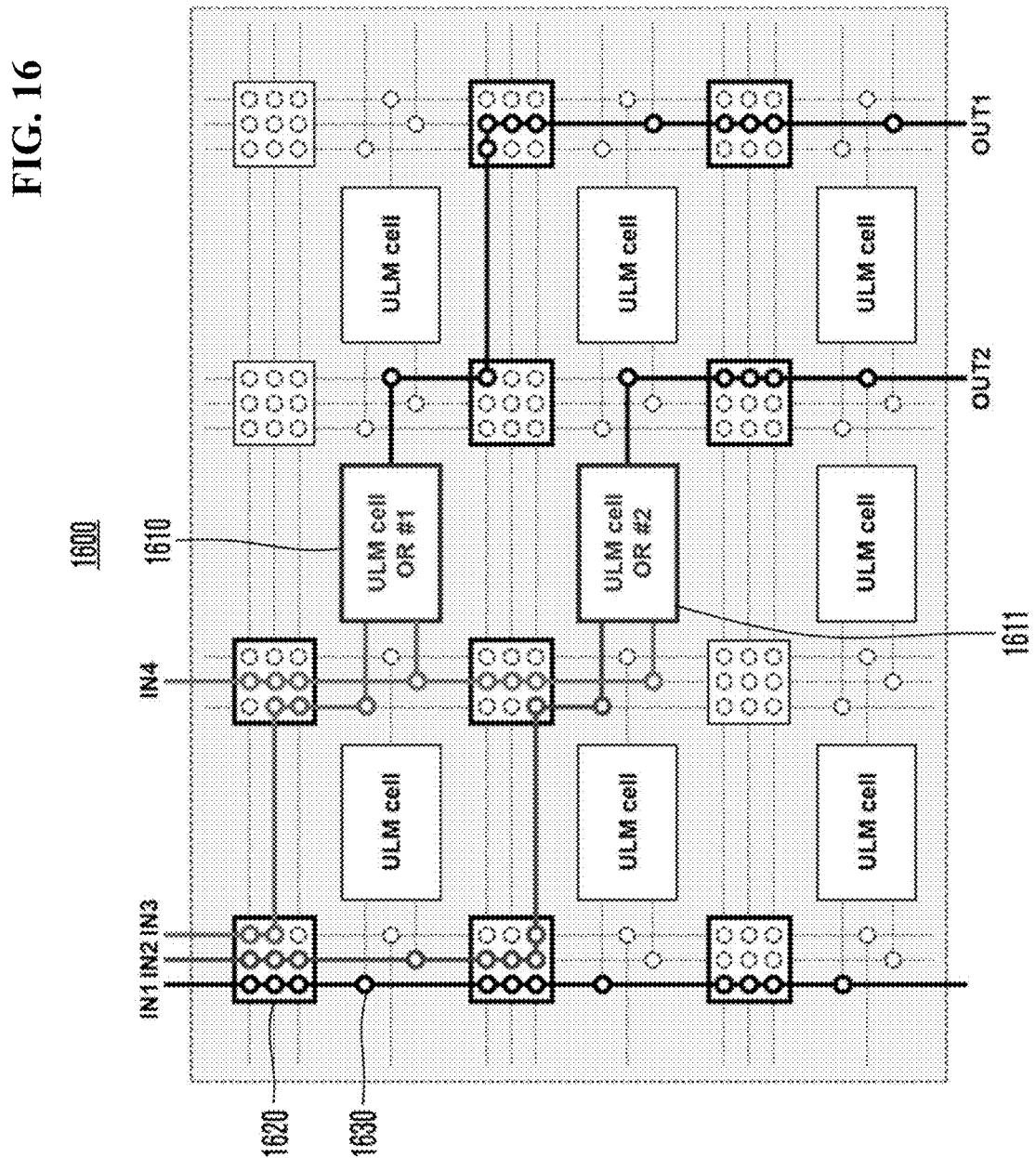
FIGS. 16 and 17 are diagrams illustrating the encoder operation of a universal logic memory block according to one embodiment of the present disclosure.
Figure 17:
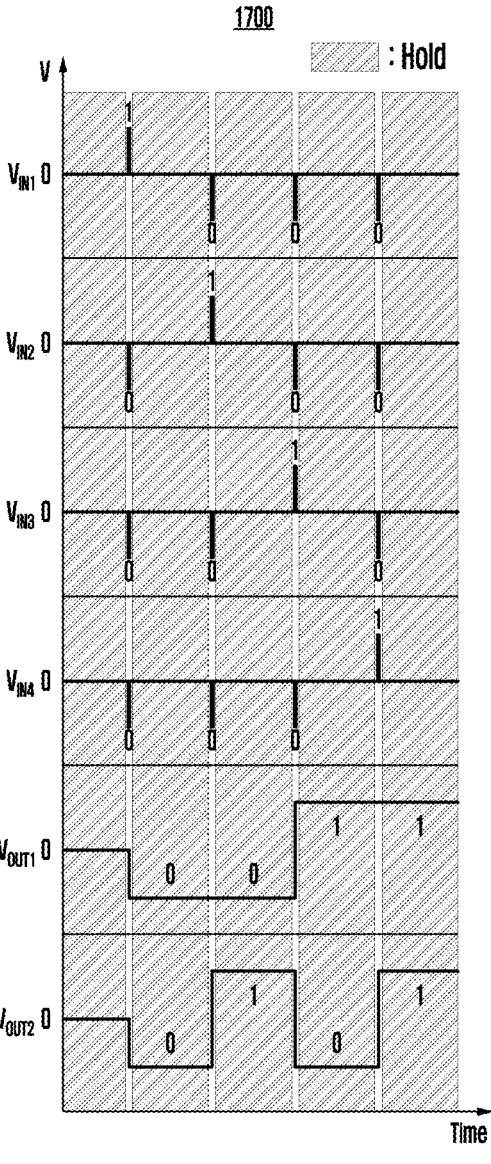

FIGS. 16 and 17 are diagrams illustrating the encoder operation of a universal logic memory block according to one embodiment of the present disclosure.

FIG. 16 illustrates a structure associated with an encoder operation of the universal logic memory block according to one embodiment of the present disclosure.

Referring to FIG. 16, a universal logic memory block 1600 according to one embodiment of the present disclosure implements an encoder operation based on the control of a switch box 1620 and a line switch 1630 for the universal logic memory cells operating as a first OR gate 1610 and a second OR gate 1611.

For example, the switch box 1620 applies a second input voltage ($V_{IN2}$), a third input voltage ($V_{IN3}$), and a fourth input voltage ($V_{IN4}$) to the universal logic memory cells operating as the first OR gate 1610 and the second OR gate 1611 among the universal logic memory cells arranged in a plurality of rows and columns. Here, the first input voltage ($V_{IN1}$) is not applied to the universal logic memory cells.

The switch box 1620 controls the output of the universal logic memory cell operating as the first OR gate 1610 as a first output (OUT1), and controls the output of the universal logic memory cell operating as the second OR gate 1611 as a second output (OUT2).

FIG. 17 illustrates a timing diagram related to an encoder operation of the universal logic memory block according to one embodiment of the present disclosure.

Referring to FIG. 17, a timing diagram 1700 according to one embodiment of the present disclosure shows an encoder operation according to the order in which a first input voltage ($V_{IN1}$), a second input voltage ($V_{IN2}$), a third input voltage ($V_{IN3}$), and a fourth input voltage ($V_{IN4}$) are output as a first output (OUT1) and a second output (OUT2).

The universal logic memory block outputs a logical operation value corresponding to a 4*2 encoder according to the distribution of input/output voltages, and performs a memory function that maintains the operation results even when all voltages are removed.

Figure 18:
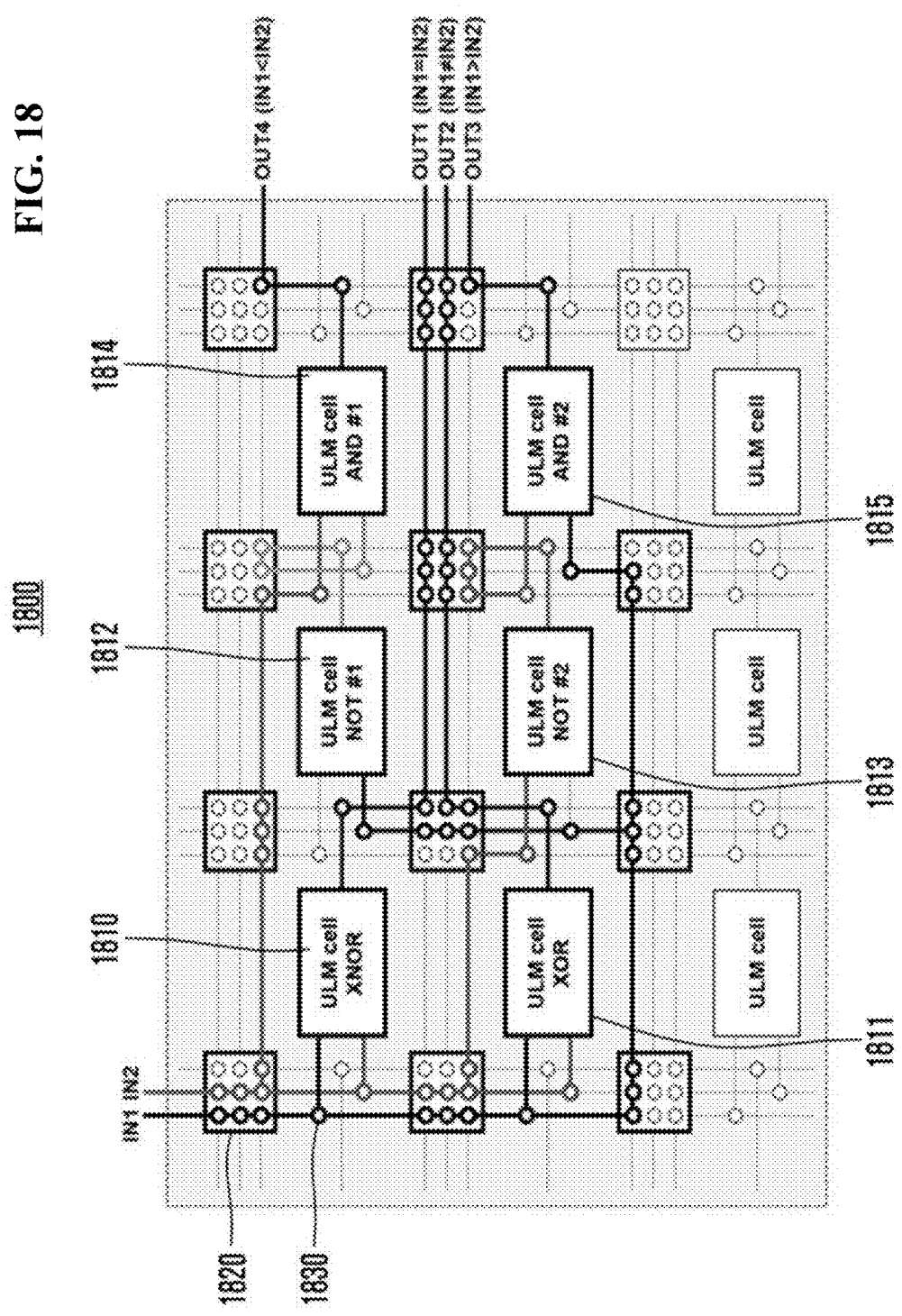
FIGS. 18 and 19 are diagrams illustrating the bit comparator operation of a universal logic memory block according to one embodiment of the present disclosure.
Figure 19:
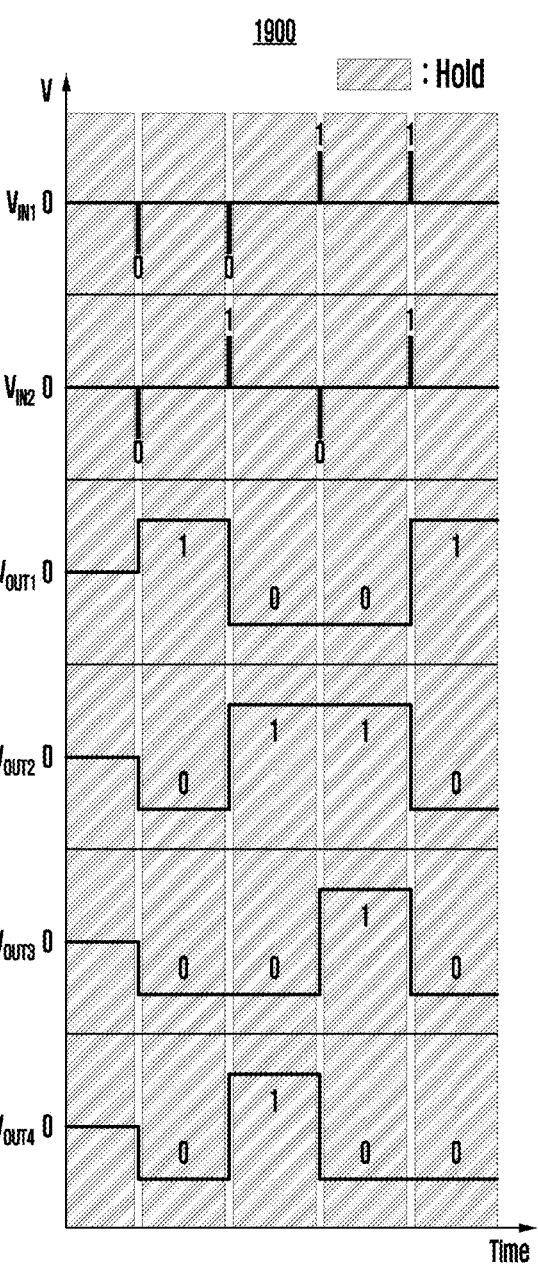

FIGS. 18 and 19 are diagrams illustrating the bit comparator operation of a universal logic memory block according to one embodiment of the present disclosure.

FIG. 18 illustrates a structure associated with a bit comparator operation of the universal logic memory block according to one embodiment of the present disclosure.

Referring to FIG. 18, a universal logic memory block 1800 according to one embodiment of the present disclosure implements a bit comparator operation based on the control of a switch box 1820 and a line switch 1830 for the universal logic memory cells operating as an XNOR gate 1810 and an XOR gate 1811, the universal logic memory cells operating as a first NOT gate 1812 and a second NOT gate 1813, and the universal logic memory cells operating as a first AND gate 1814 and a second AND gate 1815.

For example, the switch box 1820 selectively applies a first input voltage ($V_{IN1}$) and a second input voltage ($V_{IN2}$) to the universal logic memory cells operating as the XNOR gate 1810 and the XOR gate 1811, the universal logic memory cells operating as the first NOT gate 1812 and the second NOT gate 1813, and the universal logic memory cells operating as the first AND gate 1814 and the second AND gate 1815 among the universal logic memory cells arranged in a plurality of rows and columns.

In addition, the switch box 1820 controls the output of the universal logic memory cell operating as the XNOR gate 1810 as a first output (OUT1), controls the output of the universal logic memory cell operating as the XOR gate 1811 as a second output (OUT2), controls the output of the universal logic memory cell operating as the second AND gate 1815 as a third output (OUT3), and controls the output of the universal logic memory cell operating as the first AND gate 1814 as a fourth output (OUT4).

FIG. 19 illustrates a timing diagram related to a bit comparator operation of the universal logic memory block according to one embodiment of the present disclosure.

Referring to FIG. 19, a timing diagram according to one embodiment of the present disclosure shows a bit comparator operation according to the order in which a first input voltage ($V_{IN1}$) and a second input voltage ($V_{IN2}$) are output as a first output (OUT1) to a fourth output (OUT4).

The universal logic memory block outputs a logical operation value corresponding to a bit comparator according to the distribution of input/output voltages, and performs a memory function that maintains the operation results even when all voltages are removed.

Figure 20:
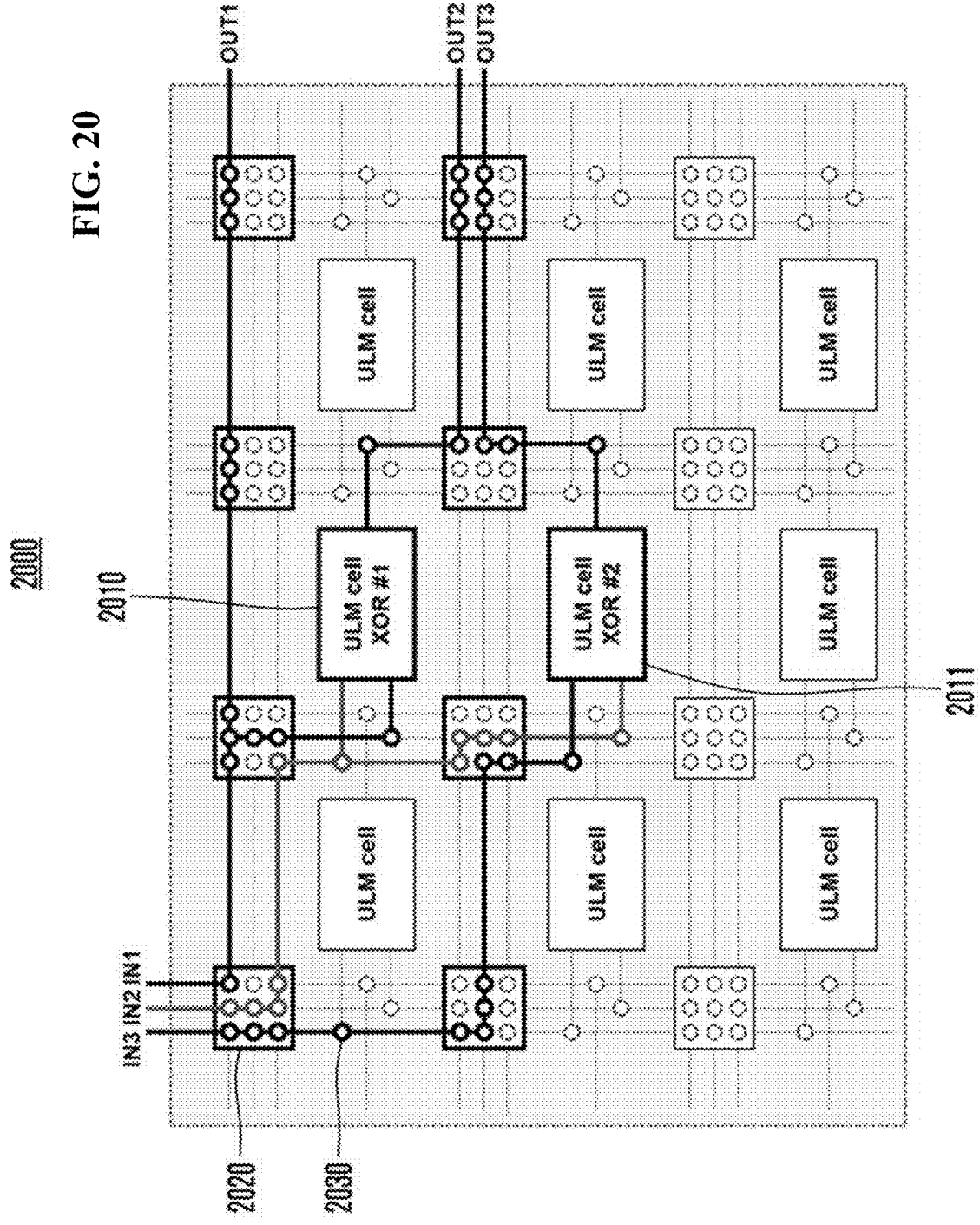
FIGS. 20 and 21 are diagrams illustrating the bit binary-to-gray code converter operation of a universal logic memory block according to one embodiment of the present disclosure.
Figure 21:
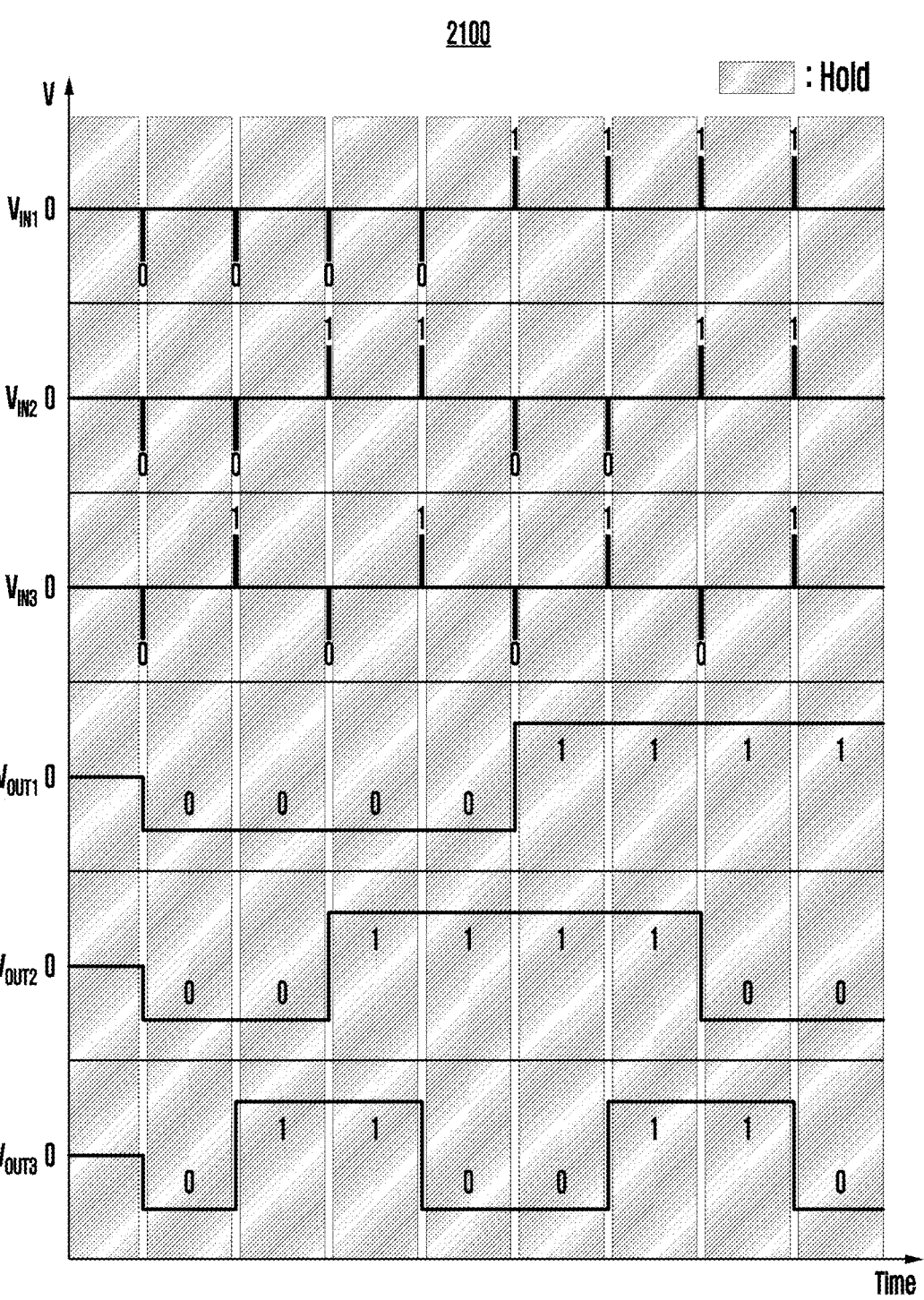

FIGS. 20 and 21 are diagrams illustrating the bit binary-to-gray code converter operation of a universal logic memory block according to one embodiment of the present disclosure.

FIG. 20 illustrates a structure associated with a bit binary-to-gray code converter operation of the universal logic memory block according to one embodiment of the present disclosure.

Referring to FIG. 20, a universal logic memory block 2000 according to one embodiment of the present disclosure implements a bit binary-to-gray code converter operation based on the control of a switch box 2020 and a line switch 2030 for the universal logic memory cells operating as a first XOR gate 2010 and a second XOR gate 2011

For example, the switch box 2020 selectively applies a first input voltage ($V_{IN1}$), a second input voltage ($V_{IN2}$), and a third input voltage ($V_{IN3}$) to the universal logic memory cells operating as the first XOR gate 2010 and the second XOR gate 2011 among the universal logic memory cells arranged in a plurality of rows and columns.

Accordingly, the switch box 2020 controls a first input voltage ($V_{IN1}$) as a first output (OUT1), controls the output of the universal logic memory cell operating as the first XOR gate 2010 as a second output (OUT2), and controls the output of the universal logic memory cell operating as the second XOR gate 2011 as a third output (OUT3).

FIG. 21 illustrates a timing diagram associated with a bit binary-to-gray code converter operation of the universal logic memory block according to one embodiment of the present disclosure.

Referring to FIG. 21, a timing diagram 2100 according to one embodiment of the present disclosure shows a bit binary-to-gray code converter operation according to the order in which a first input voltage ($V_{IN1}$) to a third input voltage ($V_{IN3}$) are output as a first output (OUT1) to a third output (OUT3).

The universal logic memory block outputs a logical operation value corresponding to a bit binary-to-gray code converter according to the distribution of input/output voltages, and performs a memory function that maintains the operation results even when all voltages are removed.

Accordingly, the present disclosure may implement a universal logic memory block that implements various combinational logical operations in a single structure by combining the results of logical operations in a plurality of universal logic memory cells using a triple-gate silicon device driven by a positive feedback loop.

The present disclosure can implement a universal logic memory block that implements various combinational logical operations in a single structure by combining the results of logical operations in a plurality of universal logic memory cells using a triple-gate silicon device driven by a positive feedback loop.

The present disclosure can implement a universal logic memory block that performs a combinational logical operation that combines logical operation results using a CMOS process and memorizes the results of the combinational logical operation.

The present disclosure can implement a universal logic memory cell using a triple-gate silicon device, which is a silicon-based feedback memory device using a conventional CMOS process, and can implement a universal logic memory block using the universal logic memory cell that performs binary combinational logical operations and memorizes the operation results.

The present disclosure can improve processing speed and integration limitation due to data bottleneck through the fusion of logical operation and storage function.

The present disclosure can implement a universal logic memory block that performs various binary combinational logical operations in a single structure through the channel mode reconfiguration characteristics of a triple-gate silicon device, thereby significantly improving computational efficiency compared to conventional CMOS logic circuits.

The present disclosure can improve standby power efficiency by using channel mode reconfiguration characteristics and excellent memory characteristics that maintain logical operation values without structural changes and external biases.

In the above-described specific embodiments, elements included in the invention are expressed in singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

What is claimed is:

1. A universal logic memory block, comprising:
universal logic memory cells comprising a first network device and a second network device using a plurality of triple-gate silicon devices;
a switch box that determines directions of an input voltage applied to the universal logic memory cells and an output voltage output from the universal logic memory cells; and
a line switch that controls interconnection between the switch box and the universal logic memory cells,
wherein, in a structure in which the universal logic memory cells are arranged according to preset settings, a combination logic operation function and memory function are performed according to interconnection control for a logic operation function of the universal logic memory cells according to the determined input voltage and output voltage directions.

2. The universal logic memory block according to claim 1, wherein the universal logic memory cells are arranged in a plurality of rows and a plurality of columns according to the preset settings, the switch box and the line switch are placed between the universal logic memory cells, the number of the line switches is determined to correspond to the number of input voltages transmitted through the switch box, and the combination logic operation function is implemented with at least one output based on the output voltage.

3. The universal logic memory block according to claim 2, wherein the switch box applies a first input voltage ($V_{IN1}$) and a second input voltage ($V_{IN2}$) to the universal logic memory cell operating as an XOR gate and the universal logic memory cell operating as an AND gate, among the logic operation functions, among the universal logic memory cells arranged in the rows and columns, outputs, as a sum(S), an output from the universal logic memory cell operating as the XOR gate, and outputs, as a carry digit (COUT), an output from the universal logic memory cell operating as the AND gate.

4. The universal logic memory block according to claim 2, wherein the switch box applies a first input voltage ($V_{IN1}$), a second input voltage ($V_{IN2}$), and a third input voltage ($V_{CIN}$) to the universal logic memory cells operating as a first XOR gate and a second XOR gate and the universal logic memory cells operating as a first AND gate and a second AND gate, among the logic operation functions, among the universal logic memory cells arranged in the rows and columns, outputs, as a sum(S), an output from the universal logic memory cell operating as the second XOR gate, and transfers outputs from the universal logic memory cells operating as the first AND gate and the second AND gate to inputs of the universal logic memory cell operating as an OR gate and then outputs an output voltage as a carry digit (COUT).

5. The universal logic memory block according to claim 2, wherein the switch box applies an input voltage ($V_{IN}$) to the universal logic memory cells operating as a first AND gate and a second AND gate among the universal logic memory cells arranged in the rows and columns, applies a selection voltage ($V_S$) to the universal logic memory cell operating as an NOT gate among the logic operation functions, outputs an output from the universal logic memory cell operating as the first AND gate as a first output (OUT1), and outputs an output from the universal logic memory cell operating as the second AND gate as a second output (OUT2).

6. The universal logic memory block according to claim 2, wherein the switch box applies a first input voltage ($V_{IN1}$) and a second input voltage ($V_{IN2}$) to the universal logic memory cells operating as a first AND gate and a second AND gate among the universal logic memory cells arranged in the rows and columns, applies a selection voltage ($V_S$) to the universal logic memory cell operating as an NOT gate among the logic operation functions, and transfers an output from the universal logic memory cell operating as the first AND gate and an output from the universal logic memory cells operating as the second AND gate as inputs of the universal logic memory cell operating as an OR gate and outputs an output voltage as an output (OUT).

7. The universal logic memory block according to claim 2, wherein the switch box selectively applies a first input voltage ($V_{IN1}$) and a second input voltage ($V_{IN2}$) to the universal logic memory cells operating as a first AND gate, a second AND gate, a third AND gate, and a fourth AND gate and the universal logic memory cells operating as a first NOT gate and a second NOT gate, among the logic operation functions, among the universal logic memory cells arranged in the rows and columns, controls an output of the universal logic memory cell operating as the first AND gate as a first output (OUT1), controls an output of the universal logic memory cell operating as the second AND gate as a second output (OUT2), controls an output of the universal logic memory cell operating as the third AND gate as a fourth output (OUT4), and controls an output of the universal logic memory cell operating as the fourth AND gate as a third output (OUT3).

8. The universal logic memory block according to claim 2, wherein the switch box applies a second input voltage ($V_{IN2}$), a third input voltage ($V_{IN3}$), and a fourth input voltage ($V_{IN4}$) to the universal logic memory cells operating as a first OR gate and a second OR gate among the universal logic memory cells arranged in the rows and columns, controls an output of the universal logic memory cell operating as the first OR gate as a first output (OUT1), and controls an output of the universal logic memory cell operating as the second OR gate as a second output (OUT2).

9. The universal logic memory block according to claim 2, wherein the switch box selectively applies a first input voltage ($V_{IN1}$) and a second input voltage ($V_{IN2}$) to the universal logic memory cells operating as an XNOR gate and an XOR gate, the universal logic memory cells operating as a first NOT gate and a second NOT gate, and the universal logic memory cells operating as a first AND gate and a second AND gate among the universal logic memory cells arranged in the rows and columns, controls an output of the universal logic memory cell operating as the XNOR gate as a first output (OUT1), controls an output of the universal logic memory cell operating as the XOR gate as a second output (OUT2), controls an output of the universal logic memory cell operating as the second AND gate as a third output (OUT3), and controls an output of the universal logic memory cell operating as the first AND gate as a fourth output (OUT4).

10. The universal logic memory block according to claim 2, wherein the switch box selectively applies a first input voltage ($V_{IN1}$), a second input voltage ($V_{IN2}$), and a third input voltage ($V_{IN3}$) to the universal logic memory cells operating as a first XOR gate and a second XOR gate among the universal logic memory cells arranged in the rows and columns, controls the first input voltage ($V_{IN1}$) as a first output (OUT1), controls an output of the universal logic memory cell operating as the first XOR gate as a second output (OUT2), and controls an output of the universal logic memory cell operating as the second XOR gate as a third output (OUT3).

11. The universal logic memory block according to claim 2, wherein the universal logic memory cell comprises a first network device and a second network device using a plurality of triple-gate silicon devices, wherein each of the triple-gate silicon devices comprises a drain region, a channel region, and a source region; a supply voltage is applied to the drain region and the source region; a gate region on which first and second programming gate electrodes and a control gate electrode are formed is formed on the channel region; depending on a level of a program voltage ($V_{PG}$) applied through the first and second programming gate electrodes, the channel region under the first and second programming gate electrodes operates in one of a first channel mode and a second channel mode; the triple-gate silicon device is determined to be in either an on-state or an off-state based on a level of a control voltage ($V_{CG}$) applied through the control gate electrode; and the first and second network devices perform the logic operation function and the memory function depending on a level of an output voltage ($V_{OUT}$) changed depending on any one of the states in any one of the channel modes.

12. The universal logic memory block according to claim 11, wherein the first and second network devices are composed of a first parallel connection formed by connecting common drain regions between a first serial connection in which the drain regions and source regions of two of the four triple-gate silicon devices are connected in series and a second serial connection in which the drain regions and source regions of the remaining two triple-gate silicon devices are connected in series and a second parallel connection formed by connecting common source regions therebetween, a drain voltage ($V_{DD}$) of the common voltage is applied through the first parallel connection of the first network device, a source voltage ($V_{SS}$) of the common voltage is applied through the second parallel connection of the second network device, and an output voltage ($V_{OUT}$) is measured at a point where the second parallel connection of the first network device and the first parallel connection of the second network device are connected.

13. The universal logic memory block according to claim 12, wherein, in the triple-gate silicon device, the drain region is in a p-doped state, the source region is in an n-doped state, the channel region is in an intrinsic state, and the channel region under the first and second programming gate electrodes operates as an n-channel corresponding to the first channel mode when a level of the program voltage ($V_{PG}$) is a positive level and operates as a p-channel corresponding to the second channel mode when a level of the program voltage ($V_{PG}$) is a negative level.

14. The universal logic memory block according to claim 13, wherein, in the universal logic memory cell, when a drain voltage ($V_{DD}$) applied to the drain region, a source voltage ($V_{SS}$) applied to the source region, the program voltage ($V_{PG}$), and the control voltage ($V_{CG}$) are applied at a zero level, the memory function is performed by maintaining a level of the output voltage ($V_{OUT}$).

* * * * *